US011636400B2

(12) United States Patent
Gu et al.

(10) Patent No.: US 11,636,400 B2
(45) Date of Patent: Apr. 25, 2023

(54) FEDERATED DOUBLY STOCHASTIC KERNEL LEARNING ON VERTICAL PARTITIONED DATA

(71) Applicants: JINGDONG DIGITS TECHNOLOGY HOLDING CO., LTD., Beijing (CN); JD FINANCE AMERICA CORPORATION, Wilmington, DE (US)

(72) Inventors: Bin Gu, Mountain View, CA (US); Harry Huang, Mountain View, CA (US)

(73) Assignees: JINGDONG DIGITS TECHNOLOGY HOLDING CO., LTD., Beijing (CN); JD FINANCE AMERICA CORPORATION, Wilmington, DE (US)

(*) Notice: Subject to any disclaimer, the term of this patent is extended or adjusted under 35 U.S.C. 154(b) by 373 days.

(21) Appl. No.: 16/910,197

(22) Filed: Jun. 24, 2020

(65) Prior Publication Data
US 2022/0004932 A1    Jan. 6, 2022

(51) Int. Cl.
G06N 20/10    (2019.01)
G06F 17/11    (2006.01)
(Continued)

(52) U.S. Cl.
CPC ............ G06N 20/10 (2019.01); G06F 17/11 (2013.01); G06F 30/27 (2020.01); G06N 7/005 (2013.01)

(58) Field of Classification Search
CPC .......... G06F 30/27; G06F 30/00; G06F 17/11; G06F 17/18; G06N 20/10; G06N 7/005; G06N 20/20
(Continued)

(56) References Cited

U.S. PATENT DOCUMENTS

2018/0137406 A1    5/2018 Howard et al.
2020/0137012 A1    4/2020 Chu et al.
2021/0365841 A1*  11/2021 Shaloudegi ............ G06N 20/00

FOREIGN PATENT DOCUMENTS

CN    110490738 A       11/2019
CN    111046433 A    *   4/2020  ......... G06F 21/6245

OTHER PUBLICATIONS

Gu, Bin et al., "Federated Doubly Stochastic Kernel Learning for Vertically Partitioned Data", Aug. 23-27, 2020, KDD '20, Association of Computing Machinery (ACM). (Year: 2020).*

(Continued)

Primary Examiner — Cedric Johnson
(74) Attorney, Agent, or Firm — Scully, Scott, Murphy & Presser, P.C.

(57) ABSTRACT

System and method for prediction using a machine learning model. The system includes a coordinator, an active computing device and a passive computing device in communication with each other. The active computing device has a processor and a storage device storing computer executable code. The computer executable code is configured to: obtain parameters of the machine learning model; retrieve an instance from the local data; sample a random direction of the instance; compute a dot product of the random direction and the instance, and calculate a random feature; compute predicted values of the instance in the active and passive computing devices and summarize them to obtain a final predicted value; determine a model coefficient using the random feature, the final predicted value, and a target value of the instance; update the machine learning model using the model coefficient; and predict a value for a new instance.

20 Claims, 17 Drawing Sheets

(51) Int. Cl.
*G06N 7/00* (2023.01)
*G06F 30/27* (2020.01)

(58) Field of Classification Search
USPC .......................................................... 706/12
See application file for complete search history.

(56) References Cited

OTHER PUBLICATIONS

Dai, Bo et al., "Scalable Kernel Methods via Doubly Stochastic Gradients", Sep. 24, 2014. (Year: 2014).*
Wei, Kang et al., "Federated Learning with Differential Privacy Algorithms and Performance Analysis", 2020, IEEE Transactions on Information Forensics and Security, vol. 15, IEEE. (Year: 2020).*
Cheng, Kewei et al., "SecureBoost: A Lossless Federated Learning Framework", Jan. 25, 2019. (Year: 2019).*
Nadeem Badshah, Facebook to contact 87 million users affected by data breach, The Guardian, Apr. 8, 2018.
Chih-Chung Chang and Chih-Jen Lin, LIBSVM: A library for support vector machines, ACM Transactions on Intelligent Systems and Technology, 2011, 2:1-27.
Kewei Cheng, Tao Fan, et al., Secureboost: A lossless federated learning framework, 2019, arXiv:1901.08755.
Bo Dai, Bo Xie, et al., Scalable kernel methods via doubly stochastic gradients, Advances in Neural Information Processing Systems, 2014, 3041-3049.
Lisandro D. Dalcin, Rodrigo R. Paz, et al., Parallel distributed computing using python, Advances in Water Resources, 2011, 34(9):1124-1139.
Wenliang Du and Mikhail J. Atallah, Privacy-preserving cooperative statistical analysis, Proceedings of the 17th Annual Computer Security Applications Conference, 2001, 102-110.
Adria Gascon, Phillipp Schoppmann, et al., Secure linear regression on vertically partitioned datasets, IACR Cryptology ePrint Archive, 2016, 892.
Adria Gascon, Phillipp Schoppmann, et al., Privacy-preserving distributed linear regression on high-dimensional data, Proceedings on Privacy Enhancing Technologies, 2017, (4):345-364.
Stephen Hardy, Wilko Henecka, et al., Private federated learning on vertically partitioned data via entity resolution and additively homomorphic encryption, 2017, arXiv preprint arXiv:1711.10677.
Alan F. Karr, Xiaodong Lin, et al., Privacy-preserving analysis of vertically partitioned data using secure matrix products, Journal of Official Statistics, 2009, 25(1):125-138.
Richard Nock, Stephen Hardy, et al., Entity resolution and federated learning get a federated resolution, 2018, arXiv preprint arXiv:1803.04035.
Ali Rahimi and Benjamin Recht, Random features for largescale kernel machines, Advances in Neural Information Processing Systems 20, 2007, 1177-1184.
Ali Rahimi and Benjamin Recht, Weighted sums of random kitchen sinks: replacing minimization with randomization in learning, Advances in Neural Information Processing Systems, 2008, 1313-1320.
Ashish P. Sanil, Alan F. Karr, et al., Privacy preserving regression modelling via distributed computation, Proceedings of the Tenth ACM SIGKDD International Conference on Knowledge Discovery and Data Mining, 2004, 677-682.
Skillicorn, D. B., and Mcconnell, S. M. 2008. Distributed prediction from vertically partitioned data, Journal of Parallel & Distributed Computing, 2007, 68(1):16-36.
Jaideep Vaidya and Chris Clifton, Privacy preserving association rule mining in vertically partitioned data, Proceedings of the Eighth ACM SIGKDD International Conference on Knowledge Discovery and Data Mining, 2002, 639-644.
Li Wan, Wee Keong Ng, Shuoguo Han, and Vincent C.S. Lee, Privacy preservation for gradient descent methods, Proceedings of the 13th ACM SIGKDD International Conference on Knowledge Discovery and Data Mining, 2007, 775-783.
Bo Xie, Yingyu Liang, and Le Song, Scale up nonlinear component analysis with doubly stochastic gradients, Advances in Neural Information Processing Systems, 2015, 2341-2349.
Jiyan Yang, Vikas Sindhwani, et al., Random laplace feature maps for semigroup kernels on histograms, Proceedings of the IEEE Conference on Computer Vision and Pattern Recognition, 2014, 971-978.
Hwanjo Yu, Jaideep Vaidya, and Xiaoqian Jiang, Privacy-preserving SVM classification on vertically partitioned data, Pacific-Asia Conference on Knowledge Discovery and Data Mining, 2006, 647-656.
Gong-Duo Zhang, Shen-Yi Zhao, Hao Gao, and Wu-Jun Li, Feature-distributed SVRG for high-dimensional linear classification, 2018, arXiv:1802.03604.
Haizhang Zhang, Yuesheng Xu, and Jun Zhang, Reproducing kernel banach spaces for machine learning, Journal of Machine Learning Research, 2009, 10:2741-2775.
PCT/CN2021/102142, International Search Report and Written Opinion, dated Sep. 27, 2021.
Leifeng net Jingdone Digital Division first publicized the full layout of the federal learning strategy, and Bo Liefeng explained the two major algorithm breakthroughs in detail https://baijiahao.baidu.com/s?id=1669668123706169753&wfr=spider&for-pc%2016%20Jun. 2020(Jun. 16, 2020).
Rudin, W., "Fourier analysis on groups", Interscience Publishers, division of John Wiley and Sons New York & London, 1962, 292 pages.
Berlinet, A., et al., "Reproducing kernel Hilbert spaces in probability and statistics", Springer Science & Business Media, 2011, 17 pages.

\* cited by examiner

Table 1

| Algorithm | Reference | Problem | Vertically Partitioned Data | Doubly Stochastic |
|---|---|---|---|---|
| LIBSVM | Chang and Lin (2011) | BC+R | No | No |
| DSG | Dai et al. (2014) | BC+R | No | Yes |
| PP-SVMV | Yu, Vaidya, and Jiang (2006) | BC+R | Yes | No |
| FDSKL | Our | BC+R | Yes | Yes |

FIG. 7A

Table 2

| Datasets | Features | Samples |
|---|---|---|
| gisette | 5,000 | 6,000 |
| phishing | 68 | 11,055 |
| a9a | 123 | 48,842 |
| ijcnn1 | 22 | 49,990 |
| cod-rna | 8 | 59,535 |
| w8a | 300 | 64,700 |
| real-sim | 20,958 | 72,309 |
| epsilon | 2,000 | 400,000 |

FIG. 7B

FEDERATED DOUBLY STOCHASTIC KERNEL LEARNING ON VERTICAL PARTITIONED DATA

CROSS-REFERENCES

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD OF THE DISCLOSURE

The present disclosure relates generally to federated learning, and more specifically related to a large scale privacy-preservation federated learning on vertically partitioned data using kernel method.

BACKGROUND OF THE DISCLOSURE

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Federated learning is a machine learning technique that trains an algorithm across multiple decentralized edge devices or servers holding local data samples, without exchanging their data samples. However, it is a challenge to process large amount of data with sufficient efficiency, scalability, and safety.

Therefore, an unaddressed need exists in the art to address the aforementioned deficiencies and inadequacies.

SUMMARY OF THE DISCLOSURE

In certain aspects, the present disclosure relates to a system for prediction using a machine learning model. In certain embodiments, the system includes an active computing device and at least one passive computing device in communication with the active computing device. Each of the active and passive computing devices includes local data. The active computing device has a processor and a storage device storing computer executable code. The computer executable code, when executed at the processor, is configured to:

obtain parameters of the machine learning model;
retrieve an instance from the local data of the active computing device;
sample a random direction of the instance;
compute a dot product of the random direction and the instance, and calculate a random feature based on the dot product;
compute a predicted value of the instance in the active computing device, instruct the at least one passive computing device to compute a predicted value of the instance in the at least one passive computing device, and summarize the predicted values from the active and the at least one passive computing devices to obtain a final predicted value of the instance, where the predicted value of the instance in the at least one passive computing device is obtained based on the local data of the at least one passive computing device;
determine a model coefficient using the random feature and a difference between the final predicted value of the instance and a target value of the instance;
update the machine learning model using the model coefficient; and
predict a value for a new instance using the machine learning model.

In certain embodiments, the parameters of the machine learning model comprises a constant learning rate.

In certain embodiments, the instance is characterized by an index, the computer executable code is configured to provide the index to the at least one passive client computer, and each of the active and the at least one passive client computers is configured to sample the random direction based on the index. In certain embodiments, the random direction is sampled from a Gaussian distribution.

In certain embodiments, the random feature is calculated using the equation $\phi_{w_i}(x_i) = \sqrt{2} \cos(w_i^T x_i + b)$, $w_i^T x_i$ is the dot product, and b is a random value. In certain embodiments, the value of b is in a range of $[0, 2\pi]$. In certain embodiments, $w_i^T x_i + b$ is calculated by $\Sigma_{\hat{i}=1}^{q}((w_i)_{\mathcal{G}_{\hat{i}}}^T (x_i)_{\mathcal{G}_{\hat{i}}} + b^{\hat{i}}) - \Sigma_{\hat{i} \neq l'}^{q} b^{\hat{i}}$, q is a number of the active and the at least one passive computing devices, $\hat{i}$ is the $\hat{i}$-th of the q computing devices, $(w_i)_{\mathcal{G}_{\hat{i}}}^T (x_i)_{\mathcal{G}_{\hat{i}}}$ is the dot product of the random direction and the instance in the $\hat{i}$-th computing device, $b^{\hat{i}}$ is a random number generated in the $\hat{i}$-th computing device, and l' is the active computing device. In certain embodiments, the value of $b^{\hat{i}}$ is in a range of $[0, 2\pi]$.

In certain embodiments, predicted value of the instance in the active computing device is calculated using a number of iterations, and the predicted value is updated in the iterations using the equation $f'(x) = f'(x) + \alpha_i \phi_{w_i}(x)$, $f'(x)$ is the predicted value of the instance, $\alpha_i$ is model coefficient of the instance, and $\phi_{w_i}(x)$ is the random feature.

In certain embodiments, the iterations equals to or is greater than 2.

In certain embodiments, the computer executable code is configured to update the machine learning model by replacing each of the previous model coefficients using the equation of $\alpha_j = (1 - \gamma\lambda)\alpha_j$, wherein $\alpha_j$ is any one of the previous model coefficients, $\gamma$ is a learning rate of the machine learning model, and $\lambda$ is a regularization parameter of the machine learning model.

In certain embodiments, communication between the active and the at least one passive computing devices is performed using a tree structure via a coordinator computing device that is in communication with the active and the at least one passive computing devices.

In certain aspects, the present disclosure relates to a method for prediction using a machine learning model. The method includes:

obtaining, by an active computing device, parameters of the machine learning model;
retrieving, by the active computing device, an instance from the local data of the active computing device;
sampling, by the active computing device, a random direction of the instance;
computing, by the active computing device, a dot product of the random direction and the instance, and calculating a random feature based on the dot product;
computing, by the active computing device, a predicted value of the instance, instructing at least one passive computing device to compute a predicted value of the instance therein, and summarizing the predicted values from the active and the at least one passive computing devices to obtain a final predicted value of the instance, wherein the predicted value of the instance in the at least one passive computing device is obtained based on the local data of the at least one passive computing device;

determining, by the active computing device, a model coefficient using the random feature and a difference between the final predicted value of the instance and a target value of the instance;

updating, by the active computing device, the machine learning model using the model coefficient; and predicting, by the active computing device, a value for a new instance using the machine learning model.

In certain embodiments, the parameters of the machine learning model comprises a constant learning rate.

In certain embodiments, the instance is characterized by an index, the computer executable code is configured to provide the index to the at least one passive client computer, and each of the active and the at least one passive client computers is configured to sample the random direction based on the index. In certain embodiments, the random direction is sampled from a Gaussian distribution.

In certain embodiments, the random feature is calculated using the equation $\phi_{w_i}(x_i)=\sqrt{2}\cos(w_i^T x_i + b)$, $w_i^T x_i$ is the dot product, and b is a random value.

In certain embodiments, $w_i^T x_i + b$ is calculated by $\Sigma_{\hat{i}=1}^{q}((w_i)_{\mathcal{G}_{\hat{i}}}^T (x_i)_{\mathcal{G}_{\hat{i}}} + b^{\hat{i}}) - \Sigma_{\hat{i} \neq l'}^{q} b^{\hat{i}}$, q is a number of the active and the at least one passive computing devices, $\hat{i}$ is the $\hat{i}$-th of the q computing devices, $(w_i)_{\mathcal{G}_{\hat{i}}}^T (x_i)_{\mathcal{G}_{\hat{i}}}$ is the dot product of the random direction and the instance in the $\hat{i}$-th computing device, $b^{\hat{i}}$ is a random number generated in the $\hat{i}$-th computing device, and l' is the active computing device.

In certain embodiments, predicted value of the instance in the active computing device is calculated using a number of iterations, and the predicted value is updated in the iterations using the equation $f^t(x)=f^t(x)+\alpha_i\phi_{w_i}(x)$, $f^t(x)$ is the predicted value of the instance, $\alpha_i$ is model coefficient of the instance, and $\phi_{w_i}(x)$ is the random feature.

In certain embodiments, the computer executable code is configured to update the machine learning model by replacing each of the previous model coefficients using the equation of $\alpha_j=(1-\gamma\lambda)\alpha_j$, wherein $\alpha_j$ is any one of the previous model coefficients, $\gamma$ is a learning rate of the machine learning model, and $\lambda$ is a regularization parameter of the machine learning model.

In certain embodiments, communication between the active and the at least one passive computing devices is performed using a tree structure via a coordinator computing device that is in communication with the active and the at least one passive computing devices.

In certain aspects, the present disclosure relates to a non-transitory computer readable medium storing computer executable code. The computer executable code, when executed at a processor of a computing device, is configured to perform the method described above.

These and other aspects of the present disclosure will become apparent from following description of the preferred embodiment taken in conjunction with the following drawings and their captions, although variations and modifications therein may be affected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment.

FIG. 7A schematically shows algorithms for comparison according to certain embodiments of the present disclosure.

FIG. 7B schematically shows benchmark datasets used in the experiments according to certain embodiments of the present disclosure.

OVERVIEW OF THE DISCLOSURE

Figure 1:
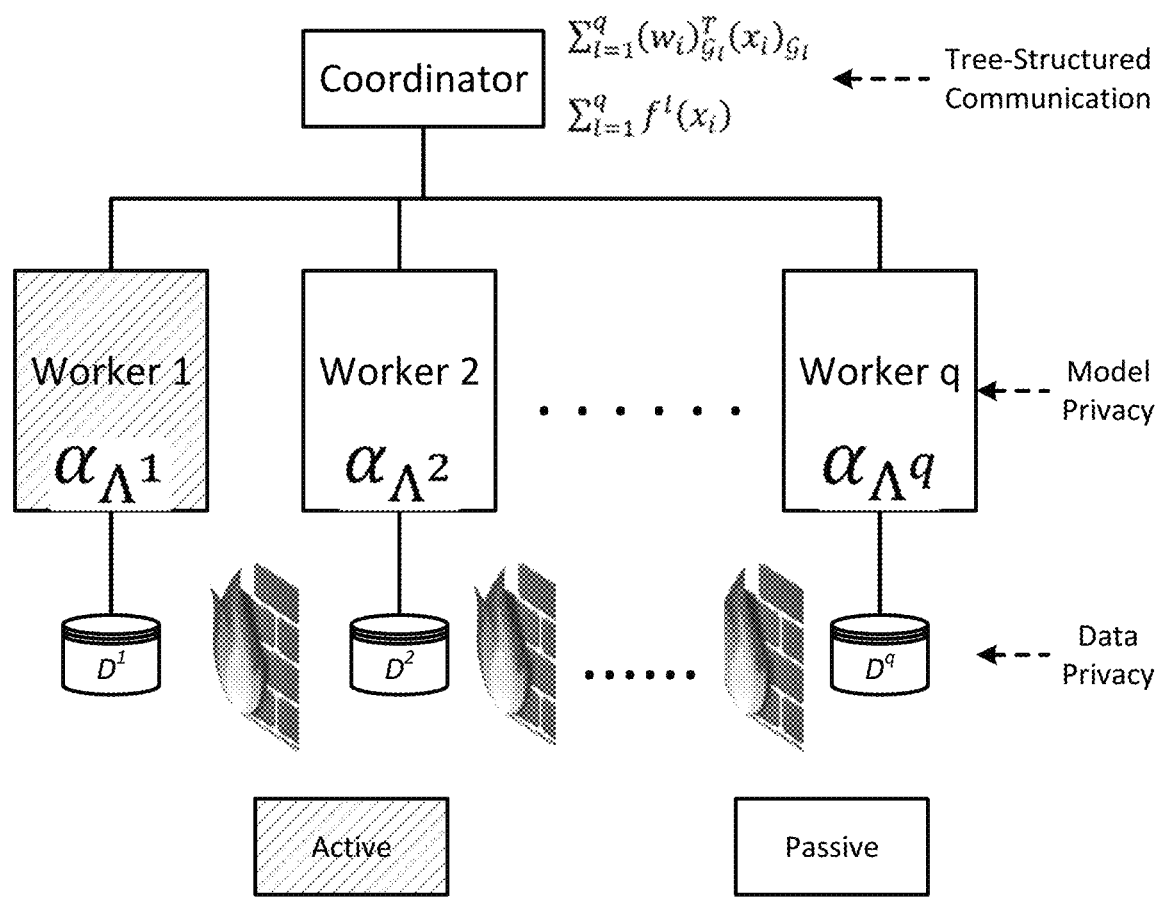
FIG. 1 schematically depicts a system of federated doubly stochastic kernel learning (FDSKL) according to certain embodiments of the disclosure.

In certain embodiments, symbols and equations are defined as follows:

$x_i$ represents a part of an instance or a sample of data, which could be available in any of the workers or servers, the instance is indexed by i;

$(x_i)_{\mathcal{G}_l}$ is an instance or a sample in a local worker or local server l;

$\mathbb{P}(w)$ is a distribution or measure, such as Gaussian distribution;

$w_i$ is the random direction corresponding to the index i;

$w_i^T$ is the transpose operation of $w_i$;

$(w_i)_{\mathcal{G}_l}$ is the random direction corresponding to the index i in the local server l;

$(w_i)_{\mathcal{G}_l}^T$ is the transpose operation of $(w_i)_{\mathcal{G}_l}$;

$w_i^T x_i$ is the dot product of $w_i^T$ and $x_i$;

$(w_i)_{\mathcal{G}_l}^T (x_i)_{\mathcal{G}_l}$ is the dot product of $(w_i)_{\mathcal{G}_l}^T$ and $(x_i)_{\mathcal{G}_l}$;

b is a random number in the range of $[0, 2\pi]$, which could be generated by a random number generator;

$(w_i)_{\mathcal{G}_l}^T (x_i)_{\mathcal{G}_l} + b$ represents adjusted dot product, where the dot product of $(w_i)_{\mathcal{G}_l}^T$ and $(x_i)_{\mathcal{G}_l}$ is adjusted by the random value b;

$w_i^T x_i + b$ represents adjusted dot product, where the dot product of $w_i^T$ and $x_i$ is adjusted by the random value b;

$f(x_i)$ is the predicted value of the instance $x_i$;

$y_i$ is the label of the instance $x_i$;

$\phi_{w_i}(x_i)$ is the random feature of the instance $x_i$, which can be calculated by $\phi_{w_i}(x_i)=\sqrt{2}\cos(w_i^T x_i + b)$;

$\alpha_i$ is the model coefficient of the instance $x_i$;

$\{\alpha_i\}_{i=1}^t$ represents model coefficient of the instance $x_i$ at different iterations, here t is the number of iterations, not transpose operator, and for each iteration i, there is a corresponding model coefficient $\alpha_i$;

$\alpha_{\wedge^l}, l=1, \ldots, q$ represents model coefficients at different iterations in a worker, here q is the total number of workers, and $\alpha_{\wedge^l}$ is the model coefficients at the l-th worker, $\wedge^l$ is the set of corresponding iteration indices, for each local worker l, there are model coefficients $\alpha_{\wedge^l}$ corresponding to each iterations of the model.

$T_0$, $T_1$, and $T_2$ are tree structures for communication.

In a lot of real-world machine learning applications, data are provided by multiple providers and each maintains private records of different feature sets about common entities. It is challenging to train these vertically partitioned data effectively and efficiently while keeping data privacy using traditional machine learning algorithms.

The present disclosure relates to large scale privacy-preservation federated learning on vertically partitioned data focusing on nonlinear learning with kernels. In certain aspects, the present disclosure provides a federated doubly stochastic kernel learning (FDSKL) algorithm for vertically partitioned data. In certain embodiments, the present disclosure uses random features to approximate the kernel mapping function and uses doubly stochastic gradients to update the kernel model, which are all computed federatedly without revealing the whole data sample to each worker. Further, the disclosure uses a tree structured communication scheme to distribute and aggregate computation which has the lowest communication cost. The disclosure proves that FDSKL can converge to the optimal solution in $O(1/t)$, where t is the number of iterations. The disclosure also provides the analysis of the data security under the semi-honest assumption. In conclusion, FDSKL is the first efficient and scalable privacy-preservation federated kernel method. Extensive experimental results on a variety of benchmark datasets show that FDSKL is significantly faster than state-of the-art federated learning methods when dealing with kernels.

Certain embodiments of the present disclosure, among other things, have the following beneficial advantages: (1) The FDSKL algorithm can train the vertically partitioned data efficiently, scalably and safely by kernel methods. (2) FDSKL is a distributed doubly stochastic gradient algorithm with constant learning rate which is much faster than the existing doubly stochastic gradient algorithms all of which are built on the diminishing learning rate, and also much faster than existing method of privacy-preserving federated kernel learning algorithm. (3) A tree structured communication scheme is used to distribute and aggregate computation which is much more efficient than the star-structured communication and ring-structured communication, which makes the FDSKL much efficient than existing federated learning algorithms. (4) Existing federated learning algorithms for vertically partitioned data use the encryption technology to keep the algorithm safety which is time consuming. However, the method of the present disclosure uses random perturbations to keep the algorithm safety which is cheaper than the encryption technology and make the FDSKL more efficient than the existing federated learning algorithms. (5) Most of existing federated learning algorithms on vertically partitioned data are limited to linear separable model. The FDSKL of the present disclosure is the first efficient and scalable federated learning algorithm on vertically partitioned data breaking the limitation of implicitly linear separability.

In certain aspects, the significant novel features of the present disclosure includes: (1) FDSKL is a distributed doubly stochastic gradient algorithm for vertically partitioned data with constant learning rate. (2) The disclosure proves the sublinear convergence rate for FDSKL. (3) The present disclosure computes $(w_i)_{\mathcal{G}_l}^T(x_i)_{\mathcal{G}_l}+b$ locally to avoid directly transferring the local data $(x_i)_{\mathcal{G}_l}$ to other workers for computing $w_i^T x_i + b$, where b is an added random number to keep the algorithm safe. (4) The disclosure provides the analysis of the data security under the semi-honest assumption.

In certain aspects, the present disclosure relates to random feature approximation. Random feature (Rahimi and Recht, 2008, 2009, which are incorporated herein by reference in their entirety) is a powerful technique to make kernel methods scalable. It uses the intriguing duality between positive definite kernels which are continuous and shift invariant (i.e., $K(x, x')=K(x-x')$) and stochastic process as shown in Theorem 0.

Theorem 0 (Rudin, 1962, which is incorporated herein by reference in its entirety). A continuous, real-valued, symmetric and shift-invariant function $K(x, x')=K(x-x')$ on $\mathbb{R}^d$ is a positive definite kernel if and only if there is a finite non-negative measure $\mathbb{R}(w)$ on $\mathbb{P}^d$, such that:

$$K(x-x') = \int_{\mathbb{R}^d} e^{iw^T(x-x')} d\mathbb{P}(w) = \int_{\mathbb{R}^d \times [0,2\pi]} 2\cos(w^T x + b)\cos(w^T x' + b) d(\mathbb{P}(w) \times \mathbb{P}(b)),$$

where $\mathbb{P}(b)$ is a uniform distribution on $[0, 2\pi]$, and $\phi_{w_i}(x_i)=\sqrt{2}\cos(w_i^T x_i + b)$.

According to Theorem 0, the value of the kernel function can be approximated by explicitly computing the random feature $\phi_w(x)$ maps as follows:

$$K(x, x') \approx \frac{1}{m}\sum_{i=1}^{m} \phi_{w_i}(x)\phi_{w_i}(x'),$$

where m is the number of random features and $w_i$ are drawn from $\mathbb{P}(w)$. Specifically, for Gaussian RBF kernel $K(x, x')=\exp(-\|x-x'\|^2/2\sigma^2)$, $\mathbb{P}(w)$ is a Gaussian distribution with density proportional to $\exp(-\sigma^2\|w\|^2/2)$. For the Laplac kernel (Yang et al., 2014, which is incorporated herein by reference by its entirety), this yields a Cauchy distribution. Note that the computation of a random feature map $\phi$ requires to compute a linear combination of the raw input features, which can also be partitioned vertically. This property makes random feature approximation well-suited for the federated learning setting.

In certain aspects, the present disclosure relates to doubly stochastic gradient. Because the functional gradient in RKHS H can be computed as $\nabla f(x)=K(x, \cdot)$, the stochastic gradient of $\nabla f(x)$ with regard to the random feature w can be denoted by:

$$\xi(\cdot)=\phi_w(x)\phi_w(\cdot).$$

Given a randomly sampled data instance (x, y), and a random feature w, the doubly stochastic gradient of the loss function L $(f(x_i), y_i)$ on RKHS with regard to the sampled instance (x, y) and the random feature w can be formulated as follows:

$$\xi(\cdot) = L'(f(x_i), y_i)\phi_w(x_i)\phi_w(\cdot).$$

Because $\nabla\|f\|_{\mathcal{H}}^2 = 2f$, the stochastic gradient of $\mathcal{R}$ (f) can be formulated as follows:

$$\hat{\xi}(\cdot) = \xi(\cdot) + \lambda f(\cdot) = L'(f(x_i), y_i)\phi_{w_i}(x_i)\phi_{w_i}(\cdot) + \lambda f(\cdot).$$

Note that we have $\mathbb{E}_{(x,y)}\mathbb{E}_w \hat{\xi}(\cdot) = \nabla \mathcal{R}$ (f). According to the stochastic gradient $\hat{\xi}(\cdot)$, we can update the solution by the step size $\gamma_t$. Then, let $f_1(\cdot)=0$, we have that:

$$f_{t+1}(\cdot) = f_t(\cdot) - \gamma_t(\xi(\cdot) + \lambda f(\cdot)) = \sum_{i=1}^{t} -\gamma_i \prod_{j=i+1}^{t}(1-\gamma_j\lambda)\xi_i(\cdot) =$$

$$\sum_{i=1}^{t} \underbrace{-\gamma_i \prod_{j=i+1}^{t}(1-\gamma_j\lambda)L'(f(x_i), y_i)\phi_{w_i}(x_i)}_{\alpha_i^t}\phi_{w_i}(\cdot)$$

From the above equation, $\alpha_i^t$ are the important coefficients which defines the model of $f(\cdot)$. Note that the model $f(x)$ in the above equation does not satisfy the assumption of implicitly linear separability same to the usual kernel model $f(x)=\sum_i^N \alpha_i K(x_i, x)$.

In certain aspects, the federated doubly stochastic kernel learning (FDSKL) algorithm is described as follows.

FDSKL System Structure: FIG. 1 schematically depicts a system of FDSKL according to certain embodiments of the present disclosure. As shown in FIG. 1, the system includes a coordinator and multiple workers. The workers include workers 1, 2, . . . , q, where worker 1 is an active worker and the rest of are passive workers. Kindly note any one of the workers can be an active worker if it initiates a federated learning. Each worker has its own privacy data, which is protected from access by other workers. The system has novel implements to achieve data privacy and model privacy, and uses special three-structured communication between the workers and the coordinator. The FDSKL structure can vertically divide the computation of the random features.

Data Privacy: To keep the vertically partitioned data privacy, certain embodiments of the disclosure divide the computation of the value of $\phi_{w_i}(x_i)=\sqrt{2}\cos(w_i^T x_i+b)$ to avoid transferring the local data $(x_i)_{\mathcal{G}_l}$ to other workers. Specifically, the disclosure sends a random seed to the l-th worker. Once the l-th worker receives the random seed, it can generate the random direction $w_i$ uniquely according to the random seed. Thus, the disclosure can locally compute $w_i^T x_i+b$, which avoids directly transferring the local data $(x_i)_{\mathcal{G}_l}$ to other workers for computing $w_i^T x_i+b$. It is hard to infer any $(x_j)_{\mathcal{G}_l}$ according to the values of $w_i^T x_i+b$ from other workers, which ensures data privacy.

Model Privacy: In addition to keep the vertically partitioned data privacy, the disclosure also keeps the model privacy. The model coefficients $\alpha_i$ are stored in different workers separately and privately. According to the location of the model coefficients $\alpha_i$, the disclosure partitions the model coefficients $\{\alpha_i\}_{i=1}^T$ as $\alpha_{\wedge^l=1}^q$, where $\alpha_{\wedge^l}$ denotes the movdel coefficients at the l-th worker, and $\wedge^l$ is the set of corresponding iteration indices. The disclosure does not directly transfer the local model coefficients $\alpha_{\wedge^l}$ to other workers. To compute f(x), the disclosure locally computes $f^l(x)=\sum_{i\in\wedge^l}\alpha_i\phi_{w_i}(x)$ and transfer it to other worker, and f(x) can be reconstructed by summing over all the $f^l(x)$. It is difficult to infer the local model coefficients $\alpha_{\wedge^l}$ based on the value of $f^l(x)$ if $|\wedge^l|\geq 2$. Thus, the disclosure achieves the model privacy.

Figure 2A:
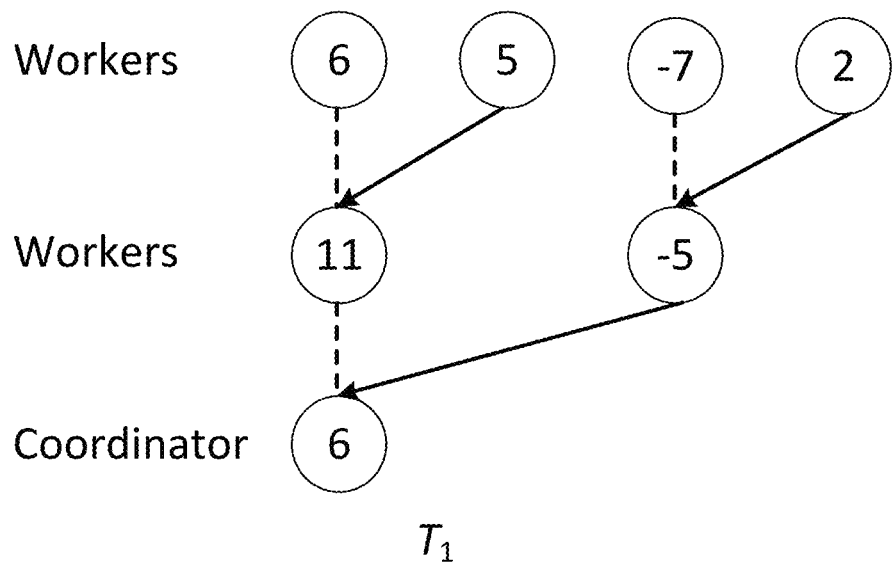
FIG. 2A schematically depicts a tree structure according to certain embodiments of the disclosure.
Figure 2B:
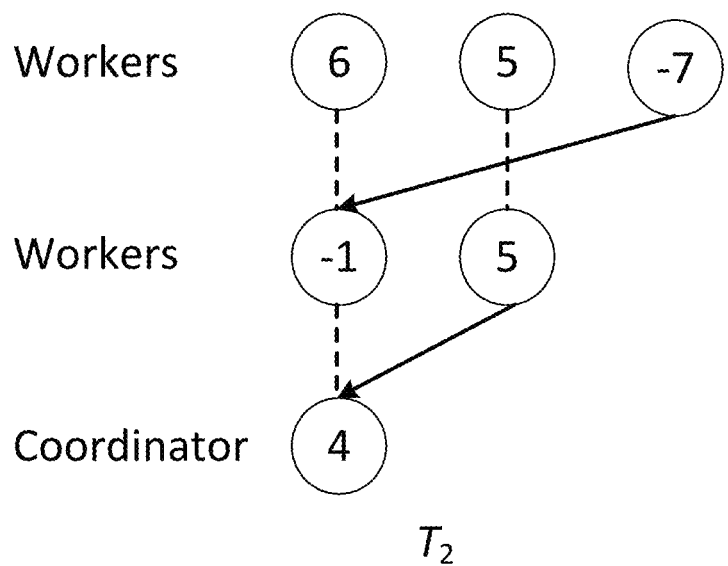
FIG. 2B schematically depicts a tree structure according to certain embodiments of the disclosure.

Tree-structured communication: In order to obtain $w_i^T x_i$ and $f(x_i)$, the disclosure needs to accumulate the local results from different workers. The present disclosure uses an efficient tree-structured communication scheme to get the global sum which is faster than the simple strategies of star-structured communication and ring-structured communication. Tree structure described by Zhang et al., 2018 is incorporated herein by reference in its entirety. FIG. 2A and FIG. 2B schematically depicts two examples $T_1$ and $T_2$ of tree-structured communication. As shown in FIG. 2A, the communication $T_1$ involves four workers, and the values for communication are 6, 5, −7, and 2 for workers 1, 2, 3 and 4, respectively. The disclosure pairs the workers so that while worker 1 adds the result from worker 2, worker 3 can add the result from work 4 simultaneously. Finally, the results from the two pairs of workers are sent to the coordinator and the disclosure obtains the global sum. In certain embodiments, when the above procedure is in a reverse order, the disclosure may call it a reverse-order tree-structured communication. Similarly, FIG. 2B shows the communication $T_2$ involves three workers.

FDSKL Algorithm: To extend stochastic gradient descent (DSG) to the federated learning on vertically partitioned data while keeping data privacy, the disclosure needs to carefully design the procedures of computing $w_i^T x_i+b$, $f(x_i)$ and updating the solution. In certain embodiments, the solution is detailed in the following procedures 1-3 and exemplified by the following algorithms 1 with reference to algorithms 2 and 3. In certain embodiments, in contrast to using the diminishing learning rate in DSG, the FDSKL uses a constant learning rate $\gamma$ which can be implemented more easily in the parallel computing environment.

1. Computing $w_i^T x_i+b$: The disclosure generates the random direction $w_i$ according to a same random seed i and a probability measure $\mathbb{P}$ for each worker. Thus, the disclosure can locally compute $(w_i)_{\mathcal{G}_l}^T(x_i)_{\mathcal{G}_l}$. To keep $(x_i)_{\mathcal{G}_l}$ private, instead of directly transferring $(w_i)_{\mathcal{G}_l}^T(x_i)_{\mathcal{G}_l}$ to other workers, the disclosure randomly generates $b^1$ uniformly from $[0, 2\pi]$, and transfer $(w_i)_{\mathcal{G}_l}^T(x_i)_{\mathcal{G}_l}+b^l$ to another worker. After all workers have calculated $(w_i)_{\mathcal{G}_l}^T(x_i)_{\mathcal{G}_l}+b^l$ locally, the disclosure can get the global sum $\Sigma_{\tilde{l}=1}^q((w_i)_{\mathcal{G}_l}^T(x_i)_{\mathcal{G}_l}+b^l)$ efficiently and safely by using a tree-structured communication scheme based on the tree structure $T_l$ for workers $\{1, \ldots, q\}$. Currently, for the l-th worker, the disclosure gets multiple values of b for q times. To recover the value of $\Sigma_{\tilde{l}=1}^q((w_i)_{\mathcal{G}_l}^T(x_i)_{\mathcal{G}_l}+b^l)$, the disclosure picks up one $b^{l'}$ from $\{1, \ldots, q\}-\{l\}$ as the value of b by removing other values of $b^{l'}$ (i.e., removing $\bar{b}^{l'}=\Sigma_{\tilde{l}\neq l}^q b^{\tilde{l}}$). In order to prevent leaking any information of $b^l$, the disclosure uses a totally different tree structure $T_2$ for workers $\{1, \ldots, q\}-\{l\}$ (For the two tree structures $T_1$ and $T_2$, they are totally different if there does not exist a subtree with more than one leaf which belongs to both of $T_1$ and $T_2$) to compute $\bar{b}^{l'}=\Sigma_{\tilde{l}\neq l}^q b^{\tilde{l}}$. The detailed procedure of computing $w_i^T x_i+b$ is summarized in Algorithm 3.

2. Computing $f(x_i)$: According to $$f_{t+1}(\cdot) = f_t(\cdot) - \gamma_t(\zeta(\cdot) + \lambda f(\cdot)) = \sum_{i=1}^{t} -\gamma_i \prod_{j=i+1}^{t}(1-\gamma_j\lambda)\zeta_i(\cdot) =$$

-continued $$\sum_{i=1}^{t} \underbrace{-\gamma_i \prod_{j=i+1}^{t} (1-\gamma_j \lambda) L'(f(x_i), y_i) \phi_{w_i}(x_i) \phi_{w_i}(\cdot)}_{\alpha_i^t},$$

the disclosure has that $f(x_i) = \sum_{i=1}^{t} \alpha_i^t \phi_{w_i}(x_i)$. However, $\alpha_i^t$ and $\phi_{w_i}(x_i)$ are stored in different workers. Thus, the disclosure first locally computes $f^l(x_i) = \sum_{i \in \wedge^l} \alpha_i^t \phi_{w_i}(x_i)$ which is summarized in Algorithm 2. By using a tree-structured communication scheme, the disclosure can get the global sum $\sum_{l=1}^{q} f^l(x_i)$ efficiently which is equal to $f(x_i)$ (please refer to Line 7 in Algorithm 1).

3. Updating Rules: Because $\alpha_i^t$ are stored in different workers, the disclosure uses a communication scheme with a reverse-order tree structure to update $\alpha_i^t$ in each workers by the coefficient $(1-\gamma\lambda)$ (please see Line 10 in Algorithm 1).

Based on these key procedures, the disclosure summarizes the FDSKL algorithm in Algorithm 1. Note that different to the diminishing learning rate used in DSG, the FDSKL of the disclosure uses a constant learning rate which can be implemented more easily in the parallel computing environment. However, the convergence analysis for constant learning rate is more difficult than the one for diminishing learning rate.

---

Algorithm 1 Vertically partitioned federated kernel learning algorithm (FDSKL) on the l-th active worker

---

Input: $\mathbb{P}(w)$, local data $D^l$, regularization parameter $\lambda$, constant learning rate $\gamma$.
1: Keep doing in parallel
2: Pick up an instance $(x_i)_{g_l}$ from the local data $D^l$ with index i.
3: Send i to other workers using a reverse-order tree structure $T_0$.
4: Sample $w_i \sim \mathbb{P}(w)$ with the random seed i for all workers.
5: Use Algorithm 3 to computer $w_i^T x_i + b$ and locally save it.
6: Computer $f^{l'}(x_i)$ for $l' = 1, ..., q$ by calling Algorithm 2.
7: Use tree-structured communication scheme based on $T_0$ to computer $f(x_i) = \sum_{l=1}^{q} f^l(x_i)$.
8: Compute $\phi_{w_i}(x_i)$ according to $w_i^T x_i + b$.
9: Compute $\alpha_i = -\gamma (L'(f(x_i), y_i)\phi_{w_i}(x_i))$ and locally save $\alpha_i$.
10: Update $\alpha_j = (1 - \gamma\lambda)\alpha_j$ for all previous j in the l-th worker and other workers.
11: End parallel loop
Output: $\alpha_{\wedge^l}$

---

Algorithm 2 Computer $f^l(x)$ on the l-th active worker

---

Input: $\mathbb{P}(w)$, $\alpha_{\wedge^l}$, $\wedge^l$, x.
1: Set $f^l(x) = 0$.
2: for each $i \in \wedge^l$ do
3: Sample $w_i \sim \mathbb{P}(w)$ with the random seed i for all workers.
4: Obtain $w_i^T x_i + b$ if it is locally saved, otherwise compute $w_i^T x_i + b$ by using Algorithm 3.
5: Compute $\phi_{w_i}(x)$ according to $w_i^T x_i + b$.
6: $f^l(x) = f^l(x) + \alpha_i \phi_{w_i}(x)$.
7: End for
Output: $f^l(x)$

---

Algorithm 3 Computer $w_i^T x_i + b$ on the l-th active worker

---

Input: $w_i$, $x_i$
{//This loop asks multiple worker running in parallel}
1: for $\hat{l} = 1, ..., q$ do
2: Compute $(w_i)_{g_l}^T (x_i)_{g_l}$ and randomly generate a uniform number from $b^l$ from $[0-2\pi]$ with the seed $\sigma^l(i)$.

---

Algorithm 3 Computer $w_i^T x_i + b$ on the l-th active worker

---

3: Calculate $(w_i)_{g_l}^T (x_i)_{g_l} + b^l$.
4: end for
5: Use tree-structured communication scheme based on the tree structure $T_1$ for workers $\{1, ..., q\}$ to computer
   $\xi = \sum_{l=1}^{q} ((w_i)_{g_l}^T (x_i)_{g_l} + b^l)$.
6: Pick up $l' \in \{1, ..., q\} - \{l\}$ uniformly at random.
7: Use tree-structured communication scheme based on the totally different tree structure $T_2$ for workers $\{1, ..., q\}-\{l'\}$ to computer
   $\bar{b}^{l'} = \sum_{l=1}^{q} b^l$.
Output: $\xi - \bar{b}^{l'}$.

---

In certain embodiments, the output $\xi - \bar{b}^{l'}$ is the $w_i^T x_i + b$ in line 5 of Algorithm 1.

Theoretical Analysis:

In certain embodiments, the present disclosure proves that FDSKL converges to the optimal solution at a rate of $O(1/t)$ as shown in Theorem 1.

Assumption 1: Suppose the following conditions hold:
1. There exists an optimal solution, denoted as $f_*$, to the objective problem.
2. There is an upper bound for the derivative of $L(u, y)$ with respect to its first argument, i.e., $|L'(u, y)| < M$.
3. The loss function $L(u,y)$ and its first-order derivative are L-Lipschitz continuous in terms of the first argument.
4. There is an upper bound k for the kernel value, i.e., $K(x, x') \leq k$. There is an upper bound $\phi$ for random feature mapping, i.e., $|\phi_w(x)\phi_w(x')| \leq \phi$.

Theorem 1:
Set $\epsilon > 0$, $$\min\left\{\frac{1}{\lambda}, \frac{\epsilon\lambda}{4M^2(\sqrt{k}+\sqrt{\phi})^2}\right\} > \gamma > 0,$$

for Algorithm 1, with $$\gamma = \frac{\epsilon v}{8kB}$$

for
$v \in (0, 1]$, under Assumption 1, the disclosure will reach $\mathbb{E}[|f_t(x)-f_*(x)|^2] \leq \epsilon$ after $$t \geq \frac{8kB\log(8ke_1/\epsilon)}{v \in \lambda}$$

iterations, where $B = [\sqrt{G_2^2 + G_1} + G_2]^2$, $$G_1 = \frac{2kM^2}{\lambda}, G_2 = \frac{k^{\frac{1}{2}}M(\sqrt{k}+\sqrt{\phi})}{2\lambda^{3/2}}$$

and $e_1 = \mathbb{E}[\|h_1-f_*\|_H^2]$.

In certain embodiments, the present disclosure proves that FDSKL can prevent inference attack (Definition 1 as follows) under the semi-honest assumption (Assumption 2 as follows):

Definition 1 (inference attack): an inference attack on the l-th worker is to infer some feature group G of one sample $x_i$ which belongs from other workers without directly accessing it.

Assumption 2 (semi-honest security): all workers will follow the protocol or algorithm to perform the correct computation. However, they may retain records of the intermediate computation results which they may use later to infer the other work's data.

Implementations and Examples of the Disclosure

The present disclosure is more particularly described in the following examples that are intended as illustrative only since numerous modifications and variations therein will be apparent to those skilled in the art. Various embodiments of the disclosure are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present disclosure. Additionally, some terms used in this specification are more specifically defined below.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the disclosure or of any exemplified term. Likewise, the disclosure is not limited to various embodiments given in this specification.

As used herein, the term "module" may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term "code", as used herein, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The term "interface", as used herein, generally refers to a communication tool or means at a point of interaction between components for performing data communication between the components. Generally, an interface may be applicable at the level of both hardware and software, and may be uni-directional or bi-directional interface. Examples of physical hardware interface may include electrical connectors, buses, ports, cables, terminals, and other I/O devices or components. The components in communication with the interface may be, for example, multiple components or peripheral devices of a computer system.

The present disclosure relates to computer systems. As depicted in the drawings, computer components may include physical hardware components, which are shown as solid line blocks, and virtual software components, which are shown as dashed line blocks. One of ordinary skill in the art would appreciate that, unless otherwise indicated, these computer components may be implemented in, but not limited to, the forms of software, firmware or hardware components, or a combination thereof.

The apparatuses, systems and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

The present disclosure will now be described more fully hereinafter with reference to the accompanying drawings, in which embodiments of the present disclosure are shown. This disclosure may, however, be embodied in many different forms and should not be construed as limited to the embodiments set forth herein; rather, these embodiments are provided so that this disclosure will be thorough and complete, and will fully convey the scope of the present disclosure to those skilled in the art.

Figure 3A:
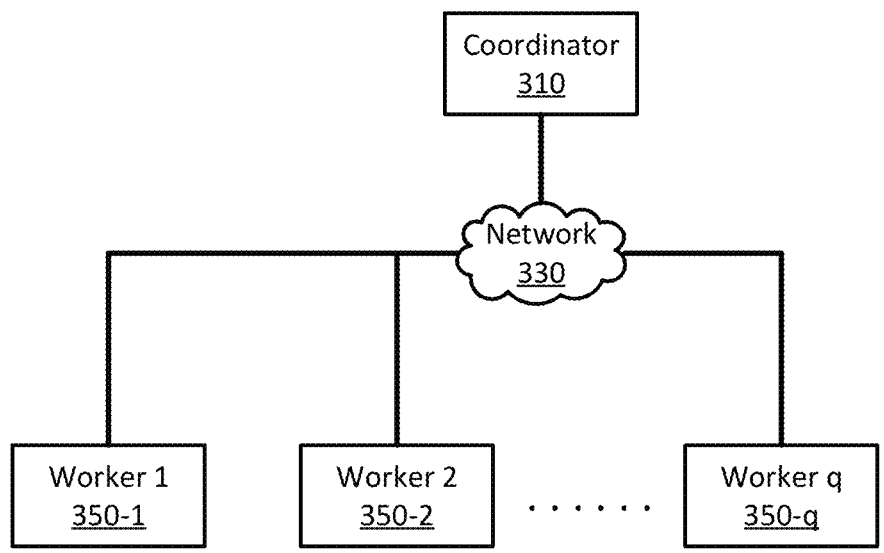
FIG. 3A schematically depicts a system for federated learning according to certain embodiments of the present disclosure.

FIG. 3A schematically depicts a system for federated learning according to certain embodiments of the present disclosure. As shown in FIG. 3A, the system 300 includes a coordinator 310 and a plurality of workers 350 in communication with each other through the network 330. In certain embodiments, each of the coordinator 310 and the workers 350 shown in FIG. 3A may be a server computer, a cluster, a cloud computer, a general-purpose computer, a headless computer, or a specialized computer, which provides federated learning capacity. In certain embodiments, each of the coordinator 310 and the workers 350 is the server computing device. In certain embodiments, each of the workers 350 includes a model for federated learning and private data, and the coordinator 310 includes a mechanism to collect certain data from the workers 350 using a tree structure. Each of the workers 350 may initiate a federated learning as an active worker, and the active worker may call one or more of the other workers as passive workers. The active worker and the passive worker may work together to train the federated learning model, but the private data are protected in the corresponding workers and not shared with other workers. In certain embodiments, the federated learning model is Federated Doubly Stochastic Kernel Learning (FDSKL), and the private data are on vertically partitioned data. The network 330 may be a wired or wireless network, and may be of various forms, such as a public network and a private network. Examples of the network 330 may include, but not limited to, a local area network (LAN) or wide area network (WAN) including the Internet. In certain embodiments, two or more different networks 330 may be applied to connect the coordinator 310 and the workers 350.

Figure 3B:
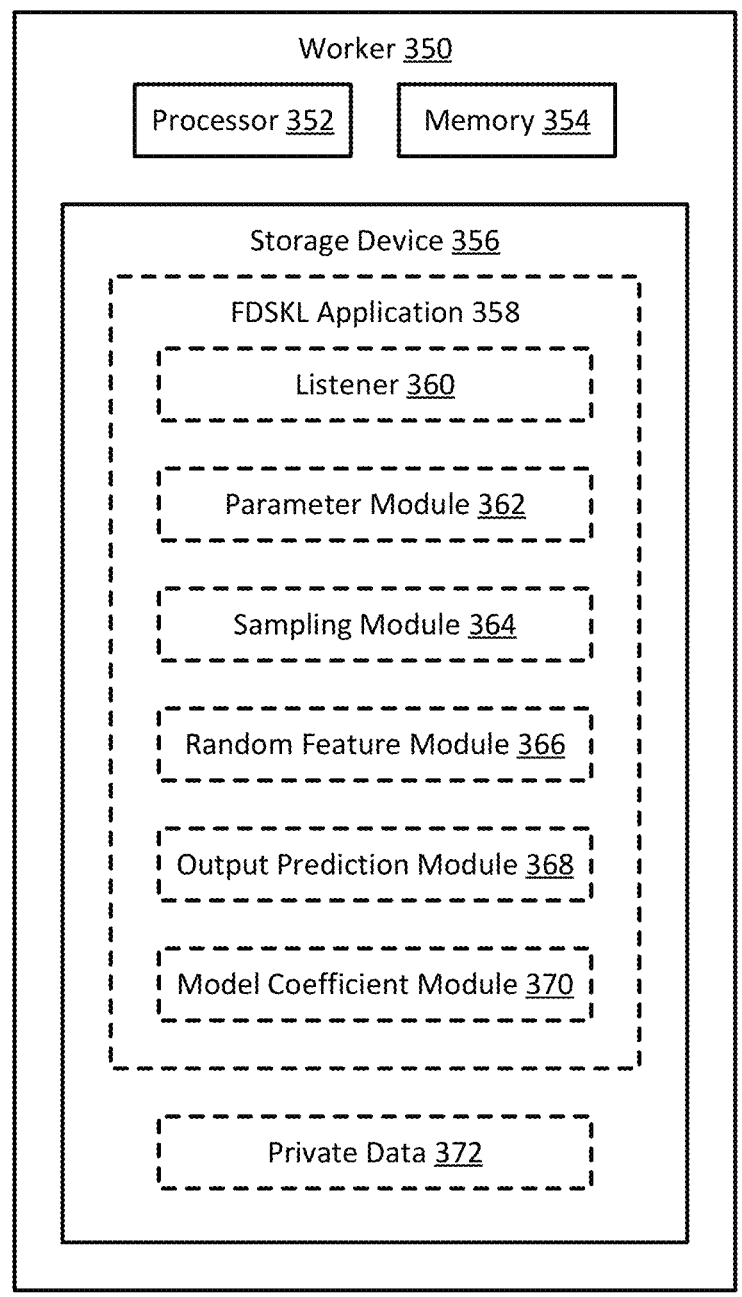
FIG. 3B schematically depicts a worker according to certain embodiments of the present disclosure.

FIG. 3B schematically depicts a worker 350 according to certain embodiments of the present disclosure. In certain embodiments, the worker 350 is the server computing device and functions as an active worker. However, the worker 350 may be any of the workers 350-1 to 350-$q$, because each of the workers can initialize a FDSKL training and operates as an active worker, and each of the workers can operate as a passive worker and provide information to the active worker. As shown in FIG. 3B, the worker 350 may include, without being limited to, a processor 352, a memory 354, and a storage device 356. In certain embodiments, the worker 350 may include other hardware components and software components (not shown) to perform its corresponding tasks. Examples of these hardware and software components may include, but not limited to, other required memory, interfaces, buses, Input/Output (I/O) modules or devices, network interfaces, and peripheral devices.

The processor 352 may be a central processing unit (CPU) which is configured to control operation of the worker 350. The processor 352 can execute an operating system (OS) or other applications of the worker 350. In certain embodiments, the worker 350 may have more than one CPU as the processor, such as two CPUs, four CPUs, eight CPUs, or any suitable number of CPUs.

The memory 354 can be a volatile memory, such as the random-access memory (RAM), for storing the data and information during the operation of the worker 350. In certain embodiments, the memory 354 may be a volatile memory array. In certain embodiments, the worker 350 may run on more than one memory 354. In certain embodiments, the worker 350 may further include graphic card to assist the processor 352 and the memory 354 with image processing and display.

The storage device 356 is a non-volatile data storage media for storing the OS (not shown) and other applications of the worker 350. Examples of the storage device 356 may include non-volatile memory such as flash memory, memory cards, USB drives, hard drives, floppy disks, optical drives, or any other types of data storage devices. In certain embodiments, the worker 350 may have multiple storage devices 356, which may be identical storage devices or different types of storage devices, and the applications of the worker 350 may be stored in one or more of the storage devices 356 of the worker 350.

In this embodiments, the processor 352, the memory 354, the storage device 356 are component of the worker 350, such as a server computing device. In other embodiments, the worker 350 may be a distributed computing device and the processor 352, the memory 354 and the storage device 356 are shared resources from multiple computers in a pre-defined area.

The storage device 356 includes, among other things, a FDSKL application 358 and private data 372. The FDSKL application 358 includes a listener 360, a parameter module 362, a sampling module 364, a random feature module 366, an output prediction module 368, and a model coefficient module 370. In certain embodiments, the storage device 356 may include other applications or modules necessary for the operation of the FDSKL application 358. It should be noted that the modules 360-370 are each implemented by computer executable codes or instructions, or data table or databases, which collectively forms one application. In certain embodiments, each of the modules may further include sub-modules. Alternatively, some of the modules may be combined as one stack. In other embodiments, certain modules may be implemented as a circuit instead of executable code. In certain embodiments, one module or a combination of the modules may also be named a model, the model may have multiple parameters that can be learned by training, and the model with well-trained parameters can be used for prediction.

The listener 360 is configured to, upon receiving an instruction for training, initialize a FDSKL training, and send a notice to the parameter module 362. The instruction may be received from an administrator or a user of the worker device 350. Under this situation, the worker 350 function as an active worker. In certain embodiments, upon receiving a request from an active worker, the listener 360 may also instruct the parameter module 360, so that the parameter module 360 and the other related modules can computer and provide information to the active worker. Under this situation, the worker 350 functions as a passive worker. The information the passive worker 350 provides may include predicted output corresponding to a sample, and adjusted dot product of random direction and the sample. Kindly note the modules of the FDSKL application 358 in the active worker and the passive worker is basically the same, and the operation of the application in the active worker can call certain functions of the application in the passive worker. Unless otherwise specified, the following modules are described in regard to an active worker.

The parameter module 362 is configured to, upon receiving the notice from the listener 360 that an FDSKL training should be performed, provide parameters of the FDSKL application to the sampling module 364. The parameters include, for example, a distribution $\mathbb{P}(w)$, a regularization parameter $\lambda$, and a constant learning rate $\gamma$. In certain embodiments, the distribution or measure $\mathbb{P}(w)$ is a Gaussian distribution. In certain embodiments, the regularization parameter $\lambda$, the constant learning rate $\gamma$, and the measure $\mathbb{P}(w)$ are predefined.

The sampling module 364 is configured to, when the parameters of the FDSKL application is available, pick up an instance or a sample $x_i$ or $(x_i)_{\varsigma_l}$ from the private data 372 with the index i. For example, the private data 372 or the local data $D^l$ in the worker 350 may include online consumption, loan and repayment information of customers. The index i is used to identify a customer, which could be personal ID of the customer. The sampling module 364 is configured to pick up the instance randomly, and therefore, the index i is also named a random seed. The sampled instance may include a set of attributes of the customer, and each attribute may correspond to a record of the customer. The record of the customer may be online consumption amount of the customer per month, the number and amount of loans the customer have taken, the repayment history of the customer, etc.

The sampling module 364 is further configured to, when the index i is available, send the index i to the other related workers via the coordinator 310. The other related workers are the workers in the system 300 that are available or relevant to the active worker's model training, and those related workers are defined as passive workers.

The sampling module 364 is also configured to sample a random direction $w_j$ from the distribution $\mathbb{P}(w)$ using the index i, and send the instance $x_i$ and the random direction $w_j$ to the random feature module 366 and the output prediction module 368. Because the instance $x_i$ is randomly picked up from the private data 372, the corresponding index i of the instance $x_i$ can also be regarded as a random value. Accordingly, the index i is used as a random seed for sampling the random direction $w_i$ from the distribution $\mathbb{P}(w)$.

The random feature module 366 is configured to, upon receiving the instance $x_i$ and the random direction $w_i$, compute dot product of the random direction $w_i^T$ and the instance $x_i$, add a random number b to the dot product to obtain adjusted dot product, save the adjusted dot product locally, calculate the random feature from the adjusted dot product, send the adjusted dot product to the output prediction module 368, and send the random feature to the model coefficient module 370. In certain embodiments, the adjusted dot product is obtained using the formula $w_i^T x_i + b$, where b is a random number in a range of 0 to $2\pi$. In certain embodiments, the random feature $\phi_{w_i}(x_i)$ is obtained using the equation $\phi_{w_i}(x_i) = \sqrt{2} \cos(w_i^T x_i + b)$.

The output prediction module 368 is configured to calculate a predicted output value of the sample $x_i$, instruct the output prediction module 368 of the other related workers to calculate their respective predicted output values, compute the final predicted output by adding the predicted output value of the active worker and the predicted output values of the passive workers together, and send the final output value to the model coefficient module 370. In certain embodiments, each of the active worker and the passive workers is configured to call Algorithm 2 described above to calculate their respective predicted output values. In certain embodiments, the respective predicted output values are communicated based on a tree structure $T_0$. In certain embodiments, the tree-structured communication $T_0$ has the same or similar structure as that shown in FIG. 2A or FIG. 2B.

The model coefficient module 370 is configured to, upon receiving the random feature $\phi_{w_i}(x_i)$ from the random feature module 366 and the final predicted value $f(x_i)$ from the output prediction module 368, compute the model coefficient $\alpha_i$ corresponding to the instance $x_i$ and save the model coefficient locally, and update all the previous model coefficients. In certain embodiments, the model coefficient module 370 is configured to calculate the model coefficient using the equation $\alpha_i = -\gamma(L'(f(x_i), y_i)\phi_{w_i}(x_i))$. here $f(x_i)$ is the final predicted output of the instance $x_i$, $y_i$ is the real value of the instance $x_i$, and the $L'(f(x_i), y_i)$ is the loss function based on the difference between $f(x_i)$ and $y_i$. When the model coefficient $\alpha_i$ is calculated and saved, model coefficient module 370 is further configured to update the previous coefficients in the model. For example, if there are j previous model coefficients, each of the j previous model coefficient is updated using the equation $\alpha_j = (1-\gamma\lambda)\alpha_j$. In certain embodiments, $\gamma$ equals to or is greater than 0, and $\lambda$ is greater than 0.

The private data 372 stores data specific for the worker 350. The private data 372 include a large number of instances or samples, and each instance can be indexed. The private data 372 stored in different workers are different, but they may be indexed or linked in the same way, for example by the identifications of customers. In an example, a first worker 350-1 may be a server computing device in a digital finance company, and its private data include online consumption, loan and repayment information. A second worker 350-2 may be a server computing device in an e-commerce company, and its private date include online shopping information. A third worker 350-3 may be a server computing device in a bank, and its private data include customer information such as average monthly deposit and account balance. If a person submits a loan application to the digital finance company, the digital finance company might evaluate the credit risk to this financial loan by comprehensively utilizing the information stored in the three workers. Therefore, to make the evaluation, the first worker 350-1 can initiate a process as the active worker, the second worker 350-2 and the third workers 350-3 can operate as passive workers. The three workers do not share private data. However, since some of the customers for the digital finance company, the e-commerce company and the bank are the same, those customers can be indexed and linked, such that their private data in the three workers can be utilized by the FDSKL model or the FDSKL application 358. In certain embodiments, each of the three workers 350-1, 350-2 and 350-2 is installed with the FDSKL application 358, and each of the workers can initialize a FDSKL training as an active worker. Kindly note that for each worker, its private data 370 is accessible by its own FDSKL application 358.

In certain embodiments, the FDSKL application 358 may further include a user interface. The user interface is configured to provide a use interface or graphic user interface in the worker 350. In certain embodiments, the user is able to configure or revise parameters for training or using the FDSKL application 358.

Figure 4:
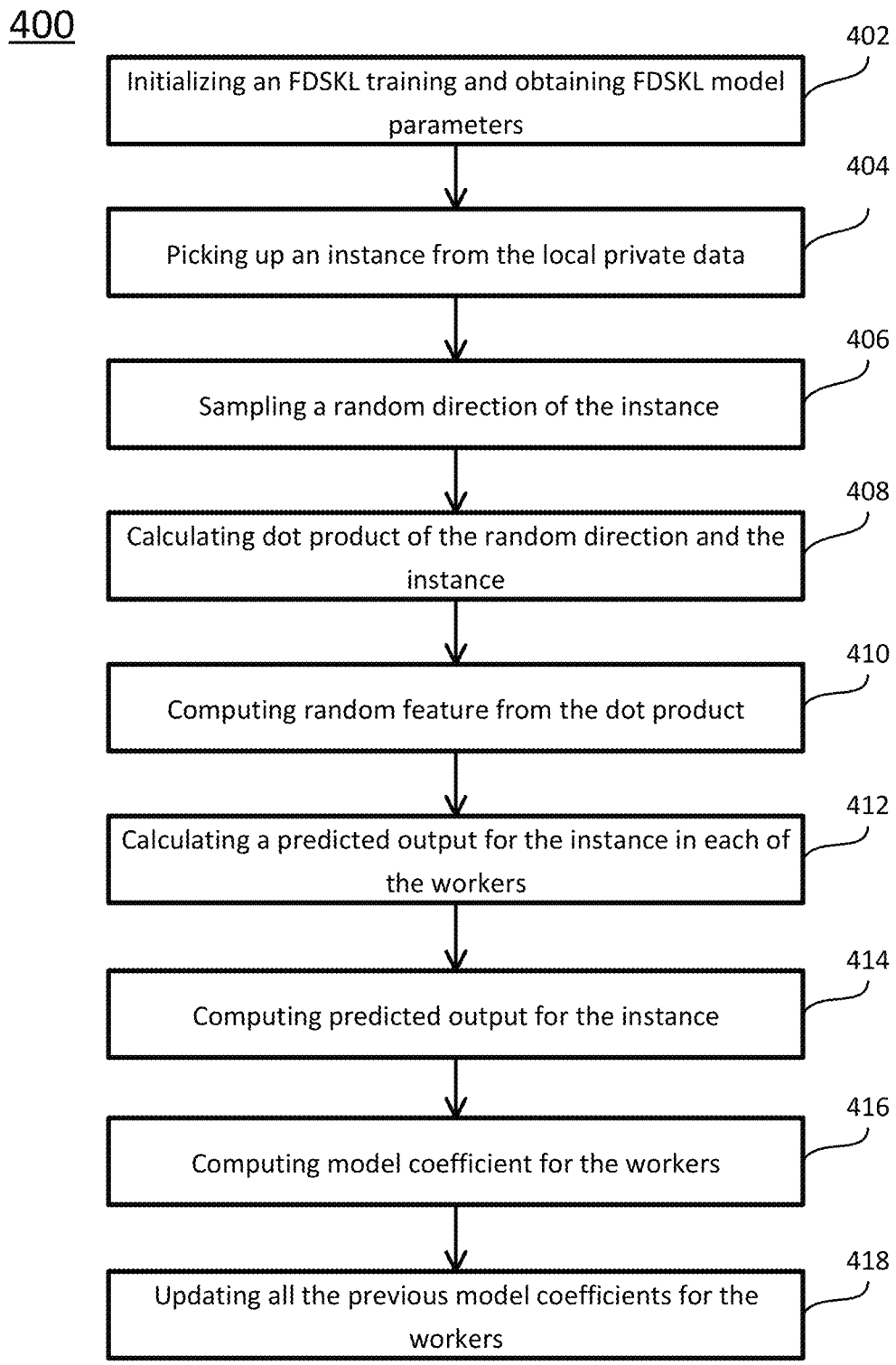
FIG. 4 schematically depicts a FDSKL training process according to certain embodiments of the present disclosure.

FIG. 4 schematically depicts a FDSKL training process according to certain embodiments of the present disclosure. In certain embodiments, the training process is performed by a server computing device, such as the worker 350 shown in FIG. 3B, and specifically by the FDSKL application 358. It should be particularly noted that, unless otherwise stated in the present disclosure, the steps of the FDSKL training process or method may be arranged in a different sequential order, and are thus not limited to the sequential order as shown in FIG. 4. In certain embodiments, the training process 400 corresponds to Algorithm 1.

As shown in FIG. 4, at procedure 402, the listener 360 of the active worker 350 receives a notice from an administrator or a user that a FDSKL training process is needed, and in response to receiving the notice, initializes a FDSKL training process by sending the notice to the parameter module 362. The parameter module 362 accordingly provides parameters of the FDSKL application 358 to the sampling module 364. The parameters include, for example, a distribution $\mathbb{P}(w)$, a regularization parameter $\lambda$, and a constant learning rate $\gamma$.

At procedure 404, the sampling module 362 randomly picks up an instance or a sample $x_i$ from the private data 372 with the index i, and sends the index i to the passive workers. The instance may include multiple attributes. In certain embodiments, the random seed i is saved in each of the active and passive workers for later use.

At procedure 406, the sampling module 362 samples random direction $w_i$ from the distribution $\mathbb{P}(w)$ based on the index i, and sends the instance $x_i$ and the sampled random direction $w_i$ to the random feature module 366 and the output prediction module 368.

At procedure 408, when the instance $x_i$ and the random direction $w_i$ are available, the random feature module 366 computes dot product of the random direction $w_i^T$ and the instance $x_i$, adds a random number to obtain adjusted dot product, and saves the adjusted dot product locally. In certain embodiments, the adjusted dot product is obtained using the formula $w_i^T x_i + b$, where b is a random number in a range of 0 to $2\pi$.

At procedure 410, after obtaining the values of $w_i^T x_i + b$, the random feature module 366 calculates the random feature $\phi_{w_i}(x_i)$ using the function $\phi_{w_i}(x_i) = \sqrt{2} \cos(w_i^T x_i + b)$, and sends the random feature to the output prediction module 366 and the model coefficient module 368.

At procedure 412, when the sample $x_i$, the weight values $w_i$, measure $\mathbb{P}(w)$, and the model coefficient $\alpha_i$ are available, the output prediction module 368 of each of the workers calculates a predicted value for the sample $x_i$. Here the sample $x_i$ and the model coefficient $\alpha_i$ are specific for each of the workers, and different workers generally have different $x_i$, and the model coefficient $\alpha_i$. But the distribution $\mathbb{P}(w)$ and the index i are the same in the different workers, and thus the different workers has the same random direction $w_i$ which is sampled from the distribution $\mathbb{P}(w)$ based on the index i. In certain embodiments, before any training process, the workers may not have any model coefficient $\alpha_i$. After each iteration of training, a corresponding model coefficient $\alpha$ is created and added in the model. In certain embodiments, the output prediction module 368 of the active worker calculates its predicted value for the sample $x_i$, and also coordinates with the passive workers to calculate their respective predicted values for their respective samples $x_i$. In certain embodiments, the output prediction module 368 of the active worker coordinates with the passive workers via the coordinator 310.

At procedure 414, when the respective predicted output values are available in the workers, the coordinator 310 uses a tree-structured communication scheme to send the predicted values from the passive workers to the active worker, the output prediction module 366 uses the predicted value of the active worker and the predicted values of the passive workers to obtain the final predicted value $f(x_i)$ for the sample $x_i$, and sends the final predicted value to the model coefficient module 368. In certain embodiments, the calculation is performed using $f(x_i)=\Sigma_{l=1}^{q} f^l(x_i)$.

At procedure 416, upon receiving the random feature $\phi_{w_i}(x_i)$ from the random feature module 366 and the final predicted value $f(x_i)$ from the output prediction module 368, the model coefficient module 370 computes the model coefficient $\alpha_i$ for the active worker corresponding to the instance $x_i$. In certain embodiments, the steps are performed similarly for all the passive workers, and each of the passive workers has newly computed model coefficient.

At procedure 418, after computing the model coefficient, the model coefficient module 368 of the active worker updates all the previous model coefficients. In certain embodiments, the passive workers would similarly perform the above steps in parallel. Specifically, the passive workers, after receiving the index i from the active worker via the coordinator 310, picks up the instance $x_i$ corresponding to the index i from its local private data 372, samples the random direction $w_i$ corresponding to the index i (or alternatively receive the random direction $w_i$ from the active worker), calculates the dot product $w_i^T x_i$ between the random direction and the instance, obtains the adjusted dot product $w_i^T x_i + b$ by adding a random value b in the range of 0 to $2\pi$, computes random feature $\phi_{w_i}(x_i)$ according to the adjusted dot product, calculates its own predicted output according to Algorithm 2, computes the final or overall predicted output $f(x_i)$ by adding the predicted outputs from all the active and passive workers, computes model coefficient $\alpha_i$ specific for the worker and saves it locally, and update all the previous model coefficients.

Kindly note the active workers and the passive workers share the same index i and the random direction $w_i$, but have their own instances $x_i$. Further, the random values b for calculating the adjusted dot products are different for different workers. In addition, each worker has its own predicted output corresponding to their own instance $x_i$, but the workers will use the same final predicted output $f(x_i)$ which is a summation of the predicted outputs from all the workers.

In certain embodiments, after the well training of the model by the above process, a prediction can be performed similarly. The difference between prediction and training includes, for example: an instance is provided for prediction while multiple instances are picked up randomly for training; the prediction is performed using the provided instance while the training is performed iteratively using randomly picked instances; the prediction can stop at procedure 414 since the prediction for the provided instance is completed, while the training needs to update the model parameters at procedures 416 and 418.

Figure 5:
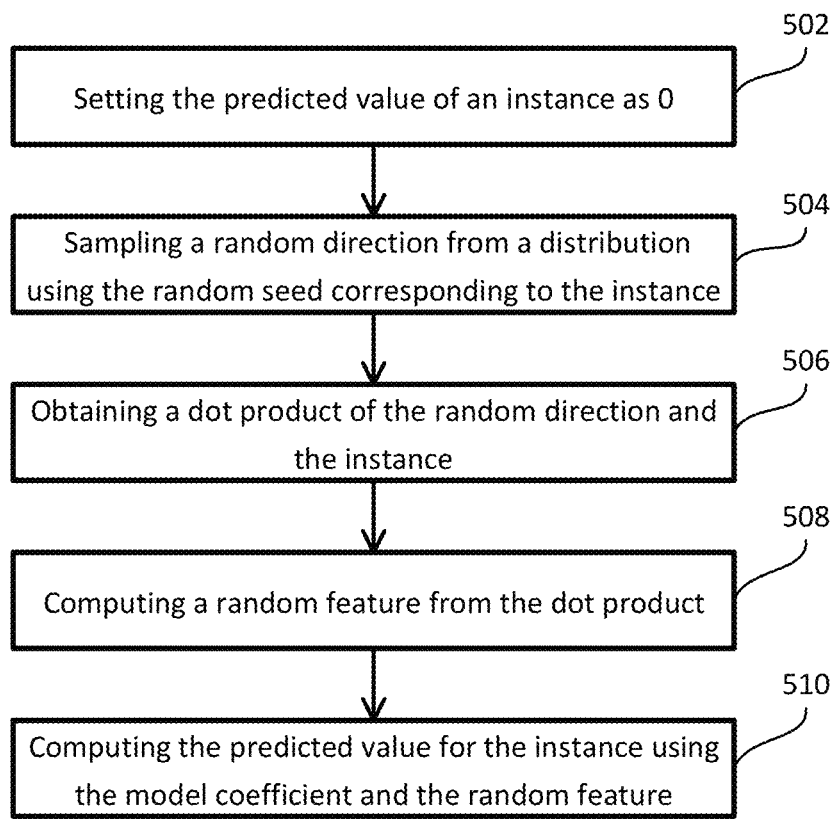
FIG. 5 schematically depicts a process for computing predicted value of a sample using the FDSKL model according to certain embodiments of the present disclosure.

FIG. 5 schematically depicts a process for computing predicted value of a sample using the FDSKL model according to certain embodiments of the present disclosure. In certain embodiments, the training process is performed by a server computing device, such as the worker 350 shown in FIG. 3B, and specifically by the FDSKL application 358. It should be particularly noted that, unless otherwise stated in the present disclosure, the steps of the FDSKL training process or method may be arranged in a different sequential order, and are thus not limited to the sequential order as shown in FIG. 5. In certain embodiments, the process corresponds to the procedure 412 in FIG. 4, and the process is performed by the output prediction module 368 of the active worker 350. In certain embodiments, the output prediction module 368 of any of the active worker and the passive workers can perform the process of FIG. 5. When the predicted value from all the workers are calculated, at procedure 414 described above, the final predicted value can be computed by adding together the predicted values from all the workers. In certain embodiments, the process 500 correspond to Algorithm 2.

As shown in FIG. 5, when the distribution $\mathbb{P}(w)$, the model coefficient $\alpha_{158}$ $^l$, the active worker l, the set of corresponding iteration indices $\wedge^l$, and the sample x are available, the process of calculating the predicted value may be performed iteratively for a predefined times. In certain embodiments, the number of iterations is defined by a user according to the data to be analyzed.

At procedure 502, the output prediction module 368 in the l-th active worker sets the predicted value $f^l(x)$ as 0.

At procedure 504, for each iteration of calculation using the sample x, the output prediction module 368 picks up a random direction $w_i$ from the distribution $\mathbb{P}(w)$ corresponding to the random seed i. In certain embodiments, the random seed i is saved for example in the above procedure 404, and is retrieved at the procedure 504.

At procedure 506, the output prediction module 368 obtains $w_i^T x + b$ if it is locally saved, and otherwise, instructs computation of $w_i^T x + b$ using Algorithm 3.

At procedure 508, the output prediction module 368 computes the random feature $\phi_{w_i}(x)$ based on $w_i^T x + b$ using the function $\phi_{w_i}(x)=\sqrt{2}\cos(w_i^T x+b)$. In certain embodiments, the random direction and the random number are different for each iteration.

At procedure 510, the output prediction module 368 computes the predicted value on the local worker $f^l(x)=f^l(x)+\alpha_i \phi_{w_i}(x)$.

In certain embodiments, after well training of the model, the procedures in FIG. 5 can be used for prediction. Specifically, when a new sample x with the index i is provided, its corresponding random direction $w_i$ can be obtained from the distribution $\mathbb{P}(w)$. The model then uses the sample and the random direction to calculate the adjusted dot product $w_i^T x+b$, uses the adjusted dot product to calculate the random feature $\phi_{w_i}(x)$, and uses the random feature to calculate the prediction f'(x) corresponding to the new sample x.

Figure 6:
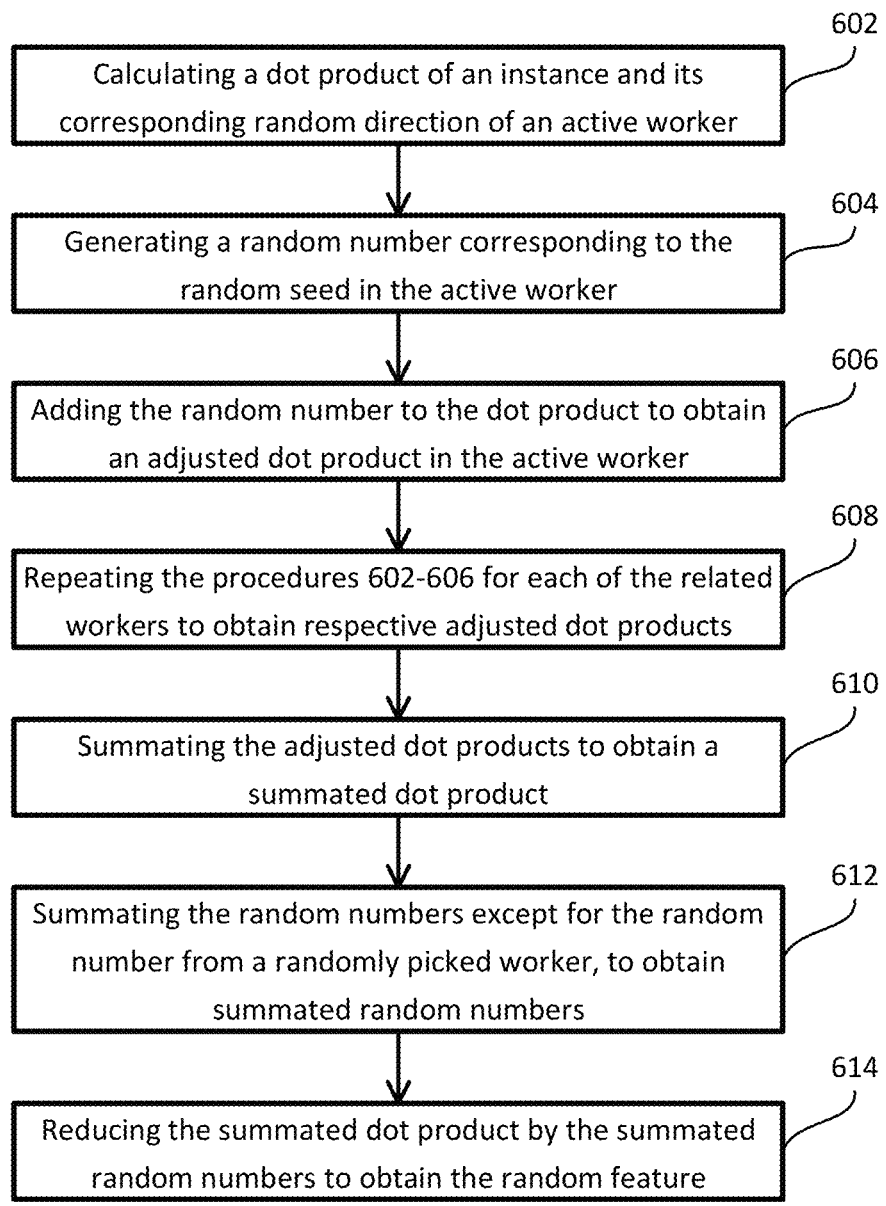
FIG. 6 schematically depicts a process for computing adjusted dot product using the FDSKL model according to certain embodiments of the present disclosure.
Figure 8A:
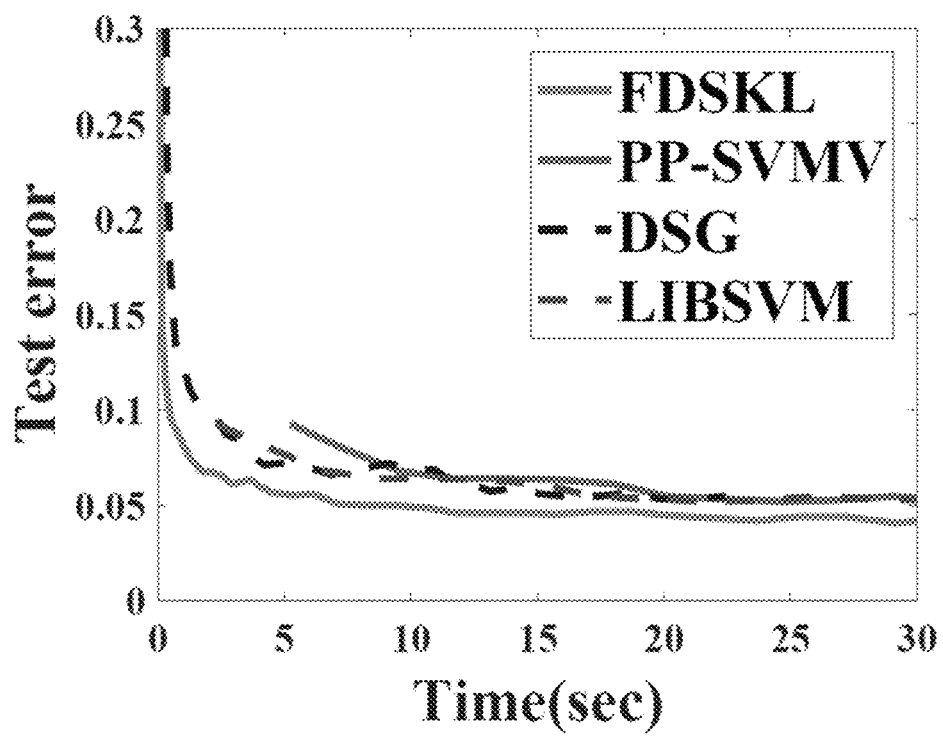
FIGS. 8A-8H schematically depict results of binary classification using the comparison method shown in FIG. 7A according to certain embodiments of the present disclosure.
Figure 8B:
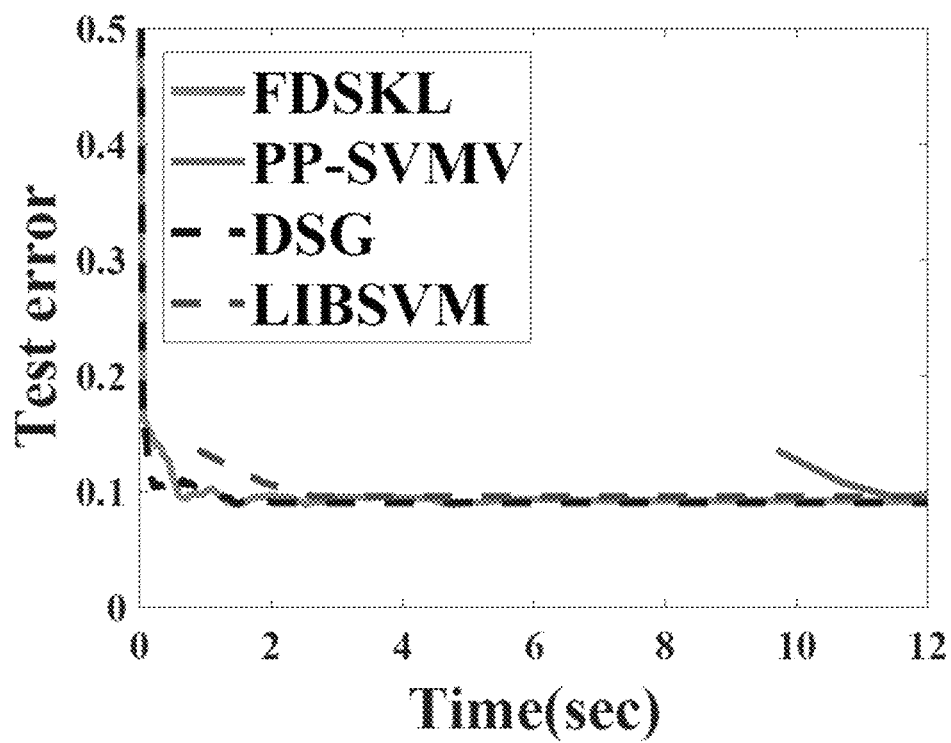
Figure 8C:
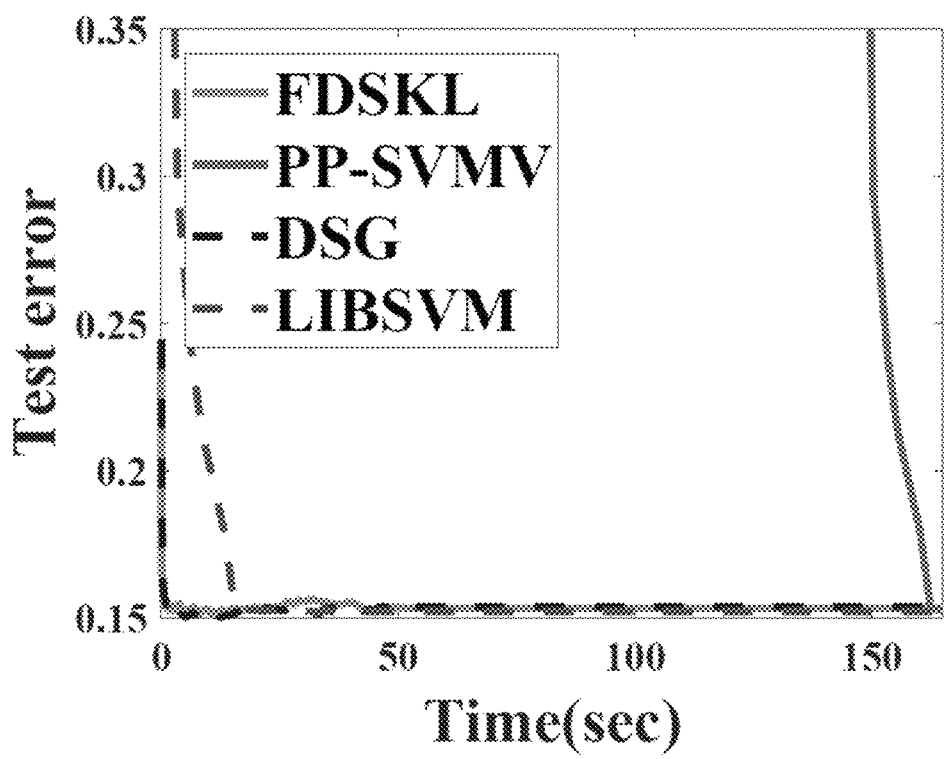
Figure 8D:
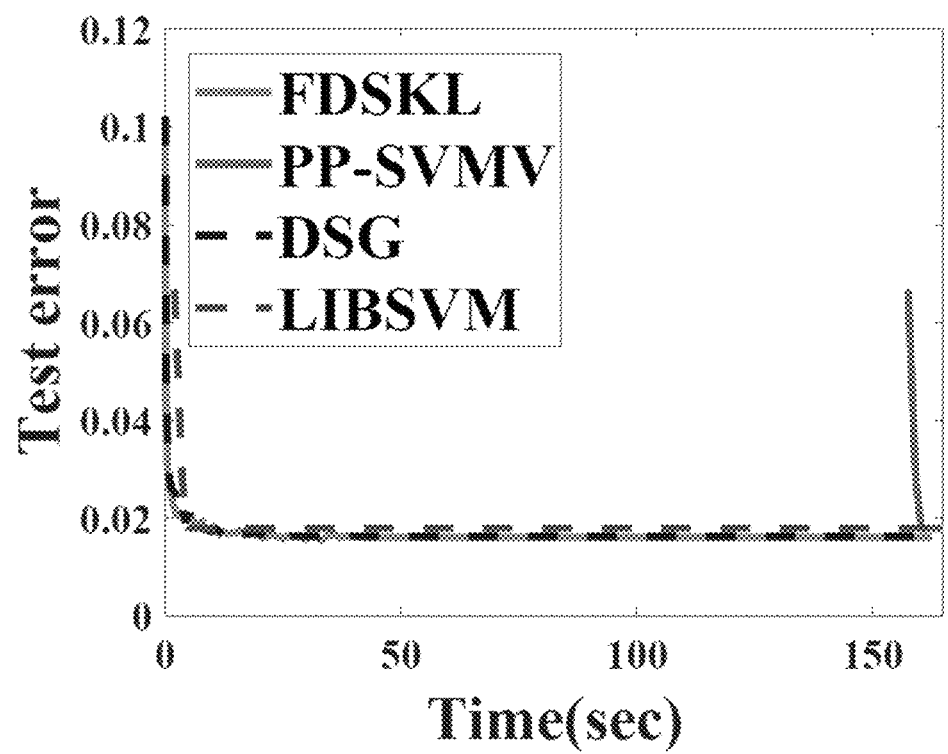
Figure 8E:
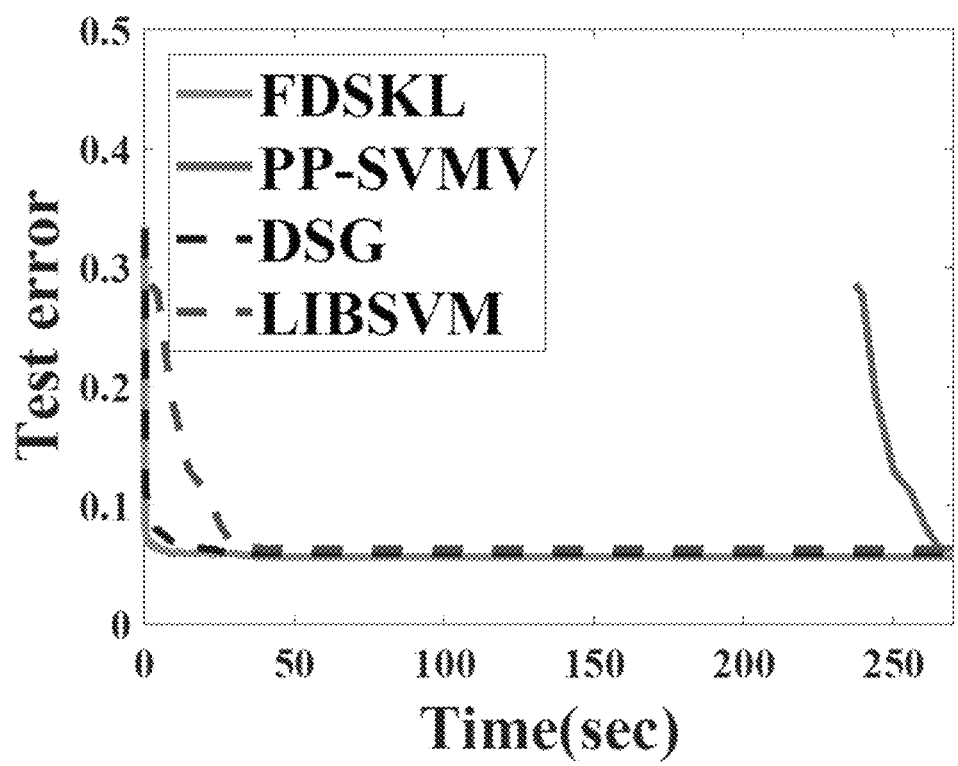
Figure 8F:
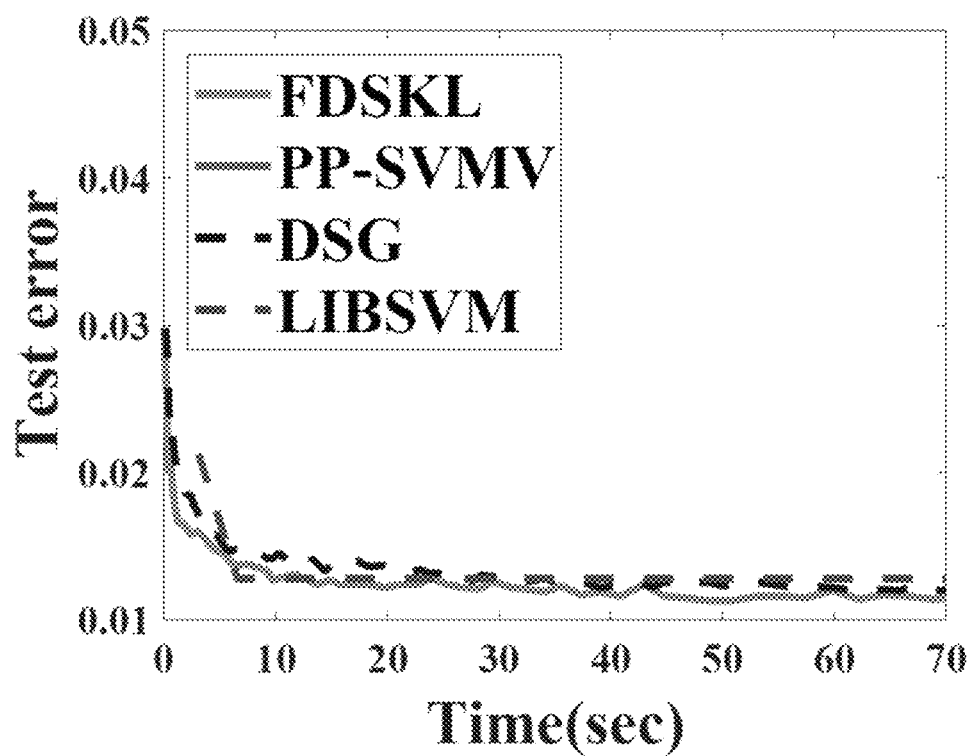
Figure 8G:
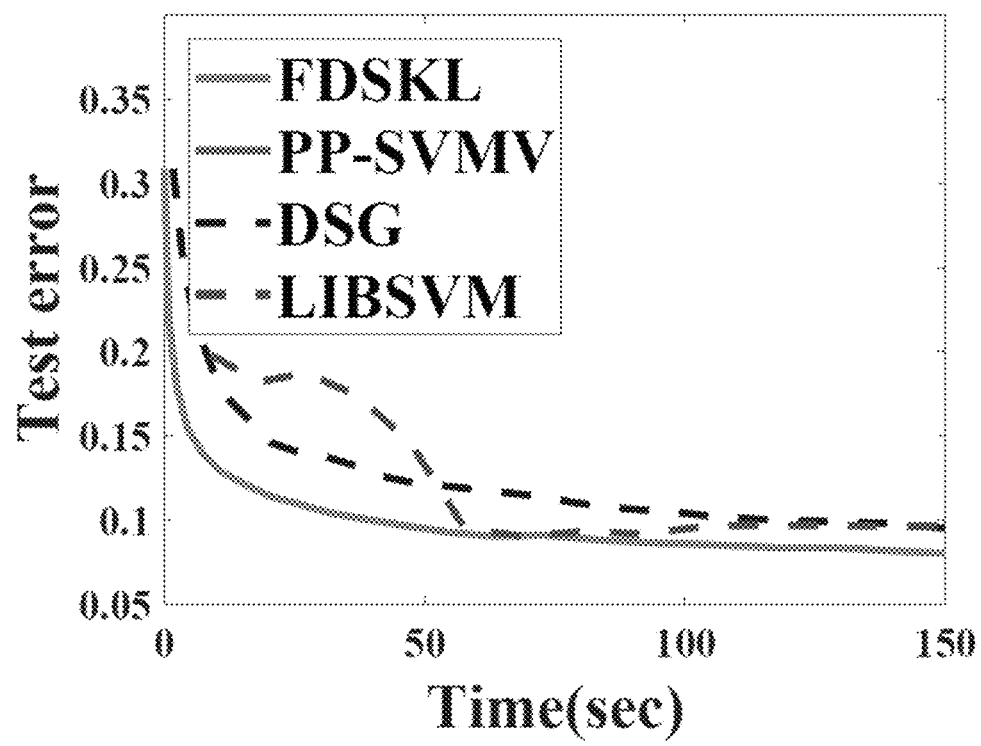
Figure 8H:
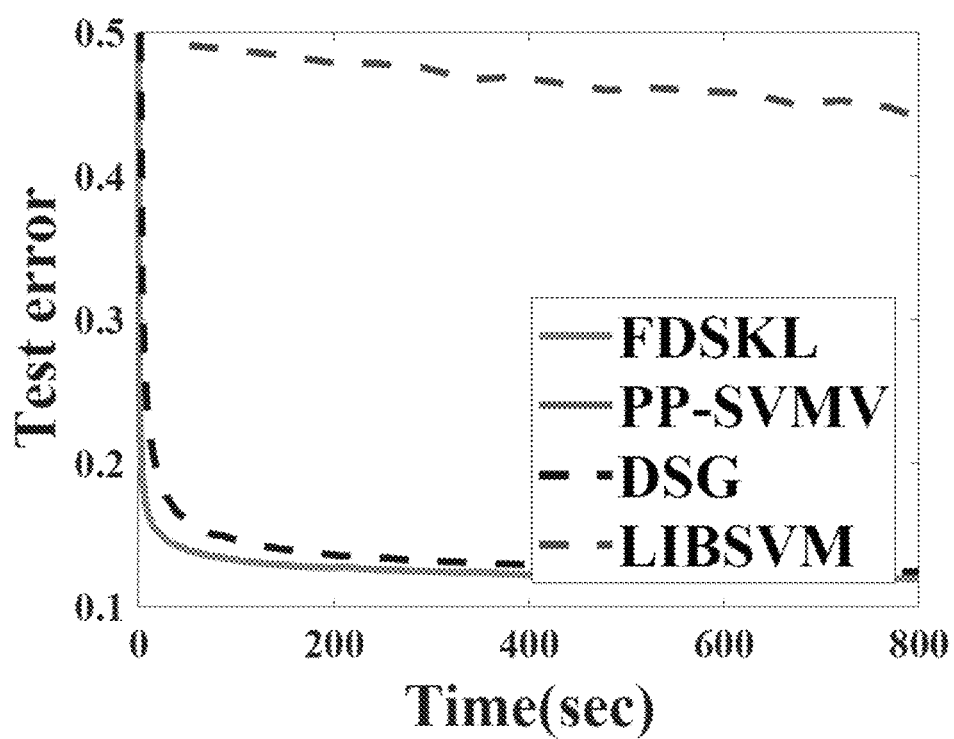
Figure 9A:
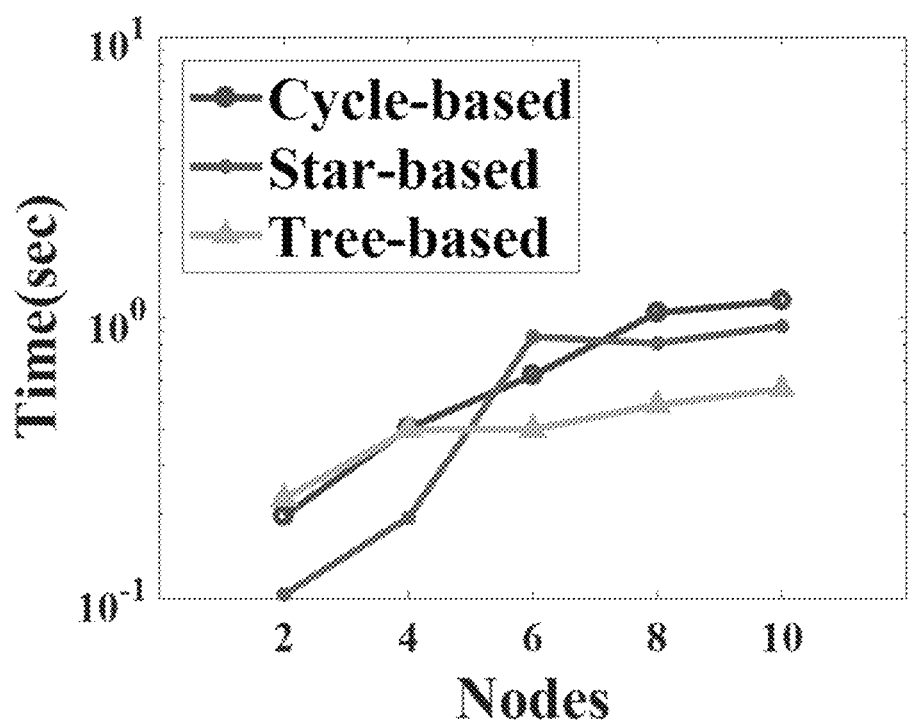
FIGS. 9A-9D schematically depict elapsed time of different structures on four datasets according to certain embodiments of the present disclosure.
Figure 9B:
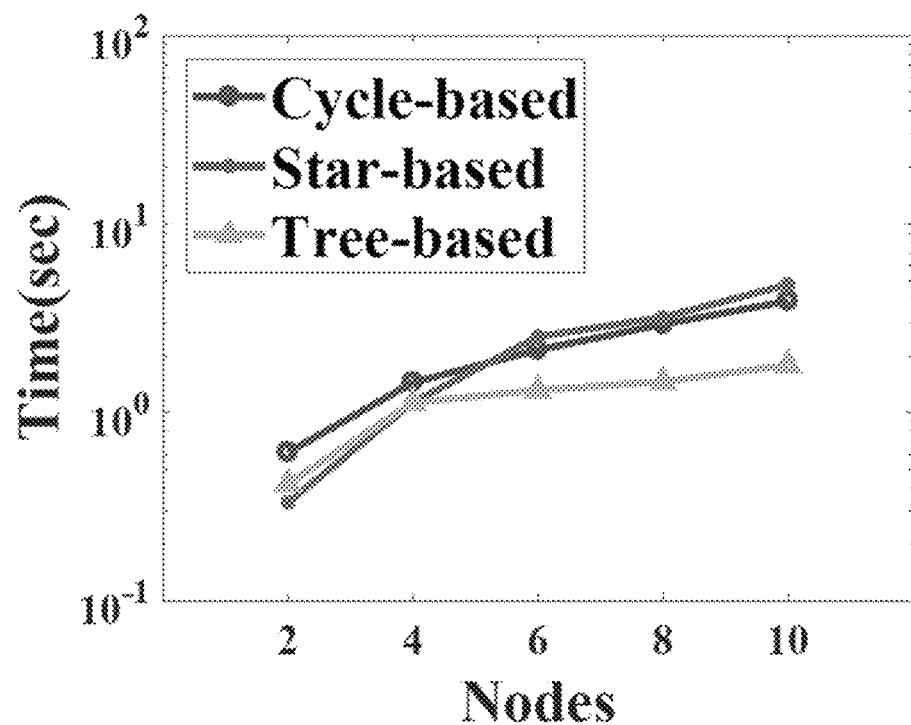
Figure 9C:
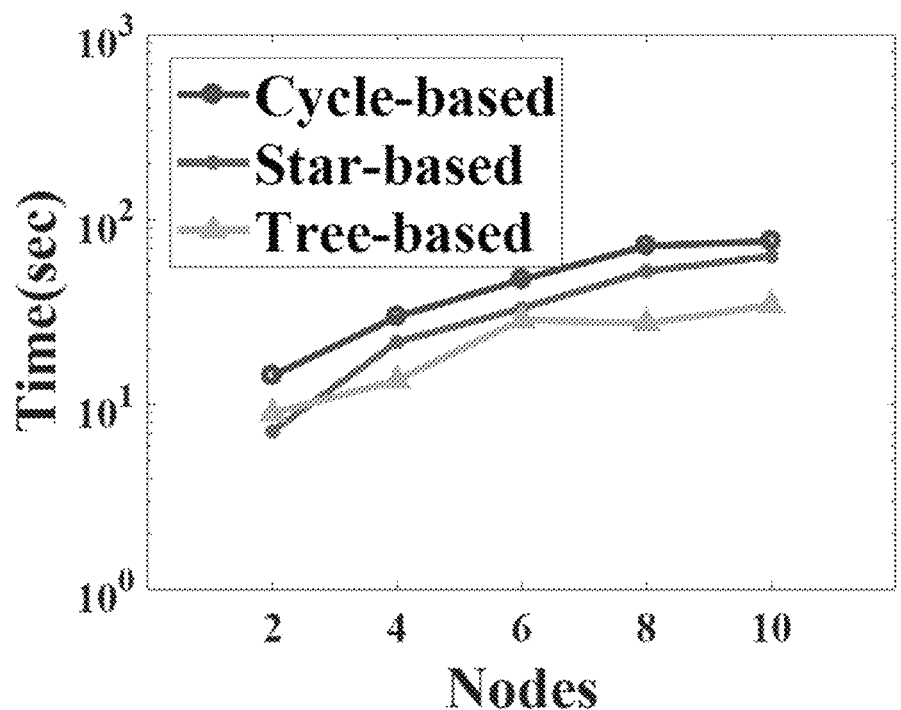
Figure 9D:
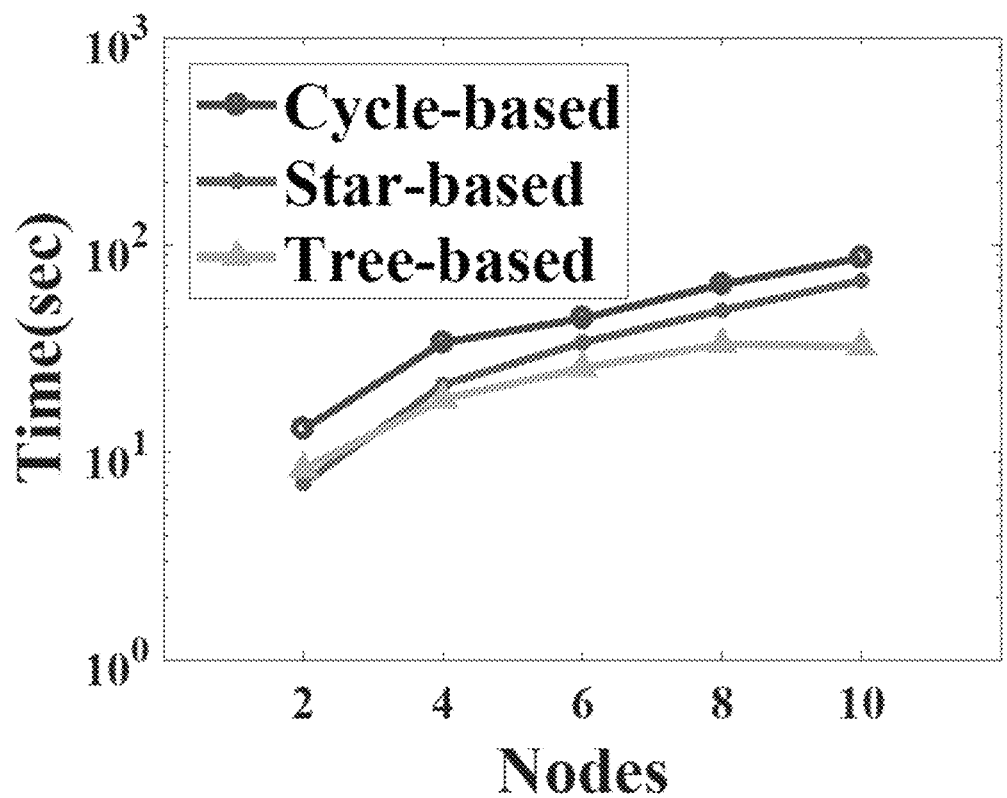
Figure 10A:
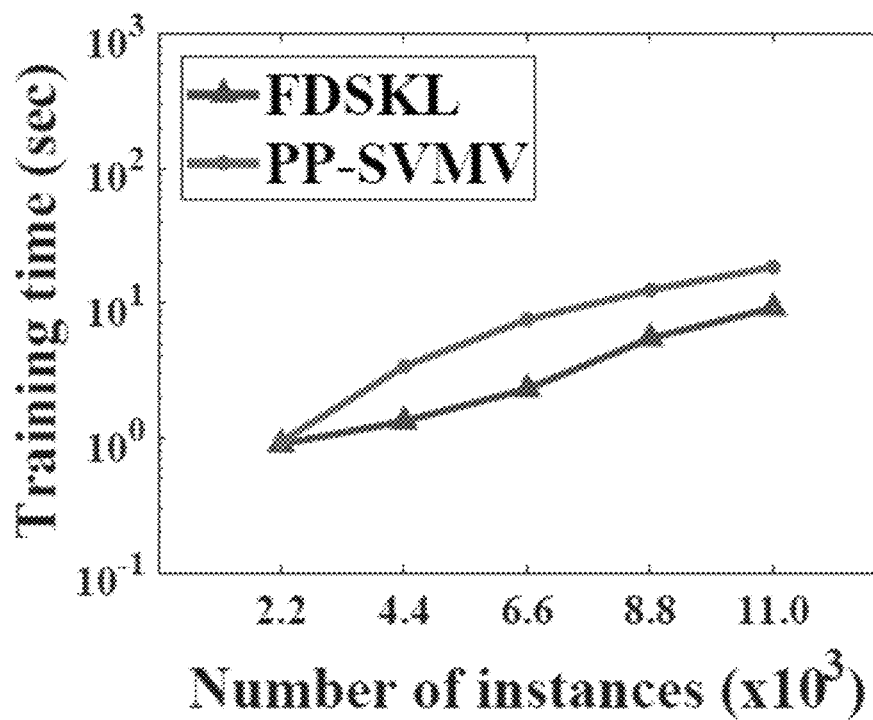
FIGS. 10A-10D schematically depict change of training time when increasing the number of training instances according to certain embodiments of the present disclosure.
Figure 10B:
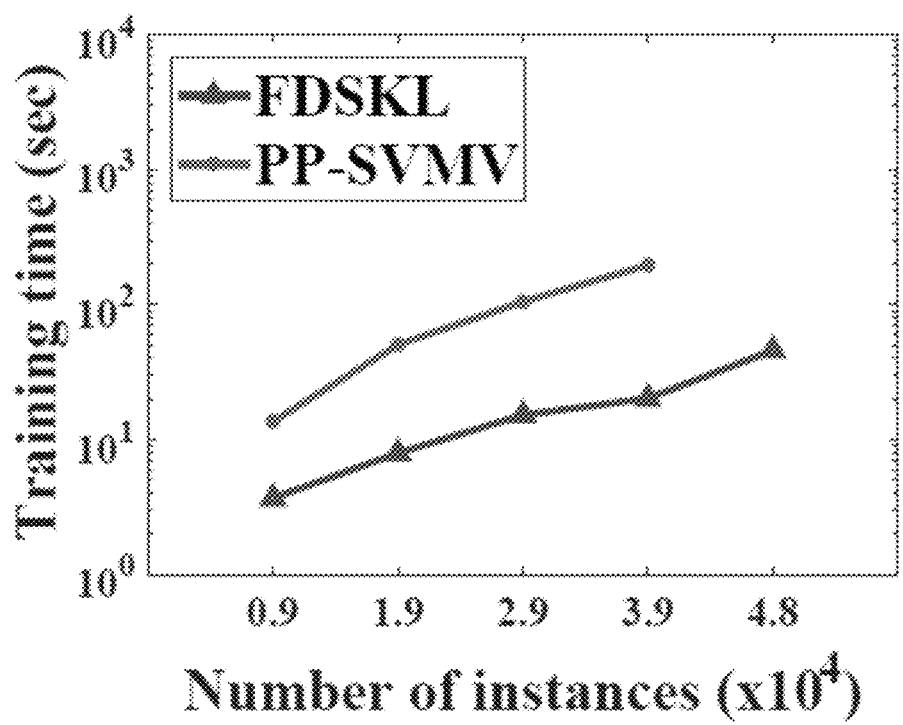
Figure 10C:
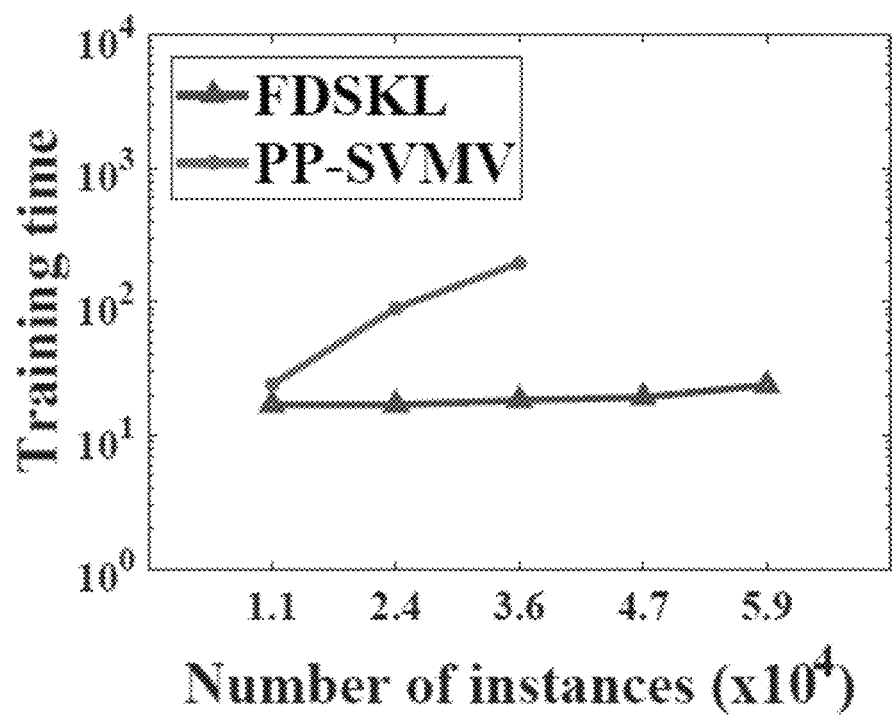
Figure 10D:
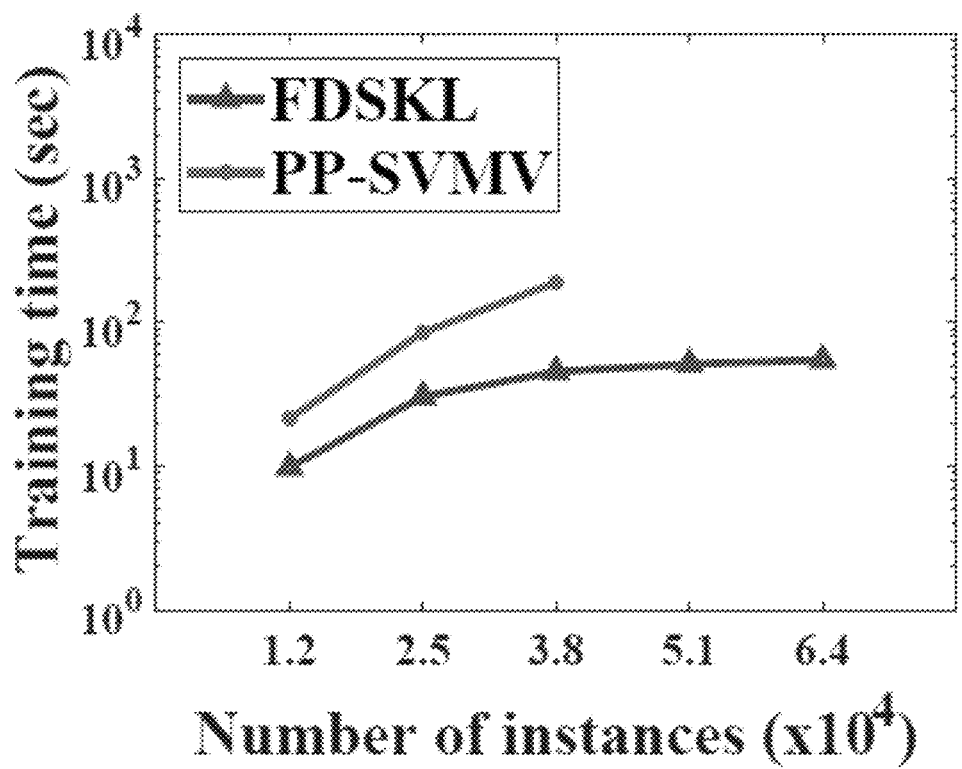

FIG. 6 schematically depicts a process 600 for computing adjusted dot product using the FDSKL model according to certain embodiments of the present disclosure. In certain embodiments, the training process is performed by a server computing device, such as the worker 350 shown in FIG. 3B, and specifically by the FDSKL application 358. It should be particularly noted that, unless otherwise stated in the present disclosure, the steps of the FDSKL training process or method may be arranged in a different sequential order, and are thus not limited to the sequential order as shown in FIG. 6. In certain embodiments, the process corresponds to the procedure 408 in FIG. 4, and the process is performed by the random feature module 366 of the active worker 350. In certain embodiments, the random feature module 366 of any of the active worker and the passive workers can perform the process of FIG. 6.

As shown in FIG. 6, when the instance $x_i$ and the corresponding random direction $w_i$ are available, at procedure 602, the random feature module 366 in the l-th active worker (or any worker) computes the dot product $w_i^T x_i$ using the instance $x_i$ and the random direction $w_i$.

At procedure 604, the random feature module 366 generates a random number b in the range of [0, 2π] using the seed σ(i). In certain embodiments, the random seeds σ(i) is generated locally, for example by any type of random number generator.

At procedure 606, the random feature module 366 adds the random number b to the dot product $w_i^T x_i$ to obtain adjusted dot product $w_i^T x_i b$.

At procedure 608, the procedures 602-606 are repeated for each of the workers 1 to q. Specifically, at the same time of performing procedures 602-606 by the l-th active worker, the random feature module 366 of the active worker also asks the passive workers to repeat the procedures 602, 604 and 606 locally, so that each of the workers calculates its own adjusted dot product. Assume there are q workers in total. For any worker $\hat{l}$ in the q workers, the random seeds is represented by $\sigma^{\hat{l}}(i)$, the generated random number in the range of [0-2π] is represented by $b^{\hat{l}}$, the dot product is represented by $(w_i)_{G_{\hat{l}}}^T (x_i)_{G_{\hat{l}}}$, and the adjusted dot product is represented by $(w_i)_{G_{\hat{l}}}^T (x_i)_{G_{\hat{l}}} + b^{\hat{l}}$. Kindly note that the $(w_i)_{G_{\hat{l}}}$ in the q workers are the same, each of which is picked up from the distribution $\mathbb{P}(w)$ using the same index i, but the $(x_i)_{G_{\hat{l}}}$ in the q workers are different because different workers stores different data for the same customer i, and the random numbers $b^{\hat{l}}$ in the q workers are different because each of them is generated locally and randomly. By performing the procedures 602-608, each of the q workers has its own calculated adjusted dot product.

At procedure 610, the random feature module 366 summates the adjusted dot products from the workers 1 to q to obtain a summated dot product. In certain embodiments, the summation is performed using the equation $\xi = \Sigma_{\hat{l}=1}^{q} ((w_i)_{G_{\hat{l}}}^T (x_i)_{G_{\hat{l}}} + b^{\hat{l}})$. Because the summations are performed using data from q workers, the summated dot product $\xi$ include q random numbers $b^{\hat{l}}$. In certain embodiments, the summation is coordinated via the coordinator 310. In certain embodiments, the summation is performed using the tree structure $T_1$.

At procedure 612, the random feature module 366 randomly selects a worker l' which is not the l-th active worker, and uses a tree structure $T_2$ to compute a summation of the random numbers b except that of the l-th worker. Since l' is not the same as l, the l'-th worker is a passive worker that is randomly selected from all the passive workers. The summation of the random numbers b is represented by $\bar{b}''$, and it is calculated using the equation $\bar{b}'' = \Sigma_{\hat{l} \neq l'}^{q} b^{\hat{l}}$. Because the summation did not include the random number b in the l'-th passive worker, the summation $\bar{b}''$ includes (q−1) of random numbers b.

At procedure 614, the random feature module 366 generates the random feature by reducing the summated random numbers from the summated dot product. The random feature is calculated as $\xi - \bar{b}''$. Because the summated dot product $\xi$ include q random numbers b from the q workers, and $\bar{b}''$ includes (q−1) random numbers b, the random number component in the $\xi - \bar{b}''$ corresponds to the random number b in the l'-th passive worker.

By the above operations described in FIGS. 4-6, the FDSKL application 358 of the l-th active worker can be trained using its local data and the data from the passive workers. the instance index i is picked up randomly by the active worker and the index i is the same for all the workers; each of the random numbers b is generated randomly and locally, and the random numbers in different workers are different from each other. The shared data by the workers are the index i, the adjusted dot product, and the predicted output. By using the specific procedures for training and the application of random numbers, there is limited data exchange between the workers and high security is achieved.

In certain aspects, the present disclosure relates to a non-transitory computer readable medium storing computer executable code. In certain embodiments, the computer executable code may be the software stored in the storage device 356 as described above. The computer executable code, when being executed, may perform one of the methods described above.

In certain aspects, the present disclosure relates to a method of using the well-trained FDSKL model to predict result for an instance. In certain embodiments, the disclosure uses the procedure described in FIG. 4 to train a random feature based FDSKL model, while uses the procedure in FIG. 5 to provide the prediction value of the well-trained FDSKL model given a sample. In certain embodiments, the disclosure makes a prediction on whether a loan should be issued to a customer based on the customer's online finance information from a digital finance company, online shopping pattern from an e-commerce company, and bank information from a traditional bank. The prediction may be initiated by a server from any of the three entities, but the three entities do not need to share their real customer data.

Example. Exemplary experiments have been conducted using the model according to certain embodiments of the present disclosure.

Design of Experiments: To demonstrate the superiority of FDSKL on federated kernel learning with vertically partitioned data, we compare with PP-SVMV (Yu, Vaidya, and Jiang, 2006). Moreover, to verify the predictive accuracy of FDSKL on vertically partitioned data, we compare with oracle learners that can access the whole data samples without the federated learning constraint. For the oracle learners, we use state-of-the-art kernel classification solvers, including LIBSVM (Chang and Lin, 2011) and DSG (Dai et al., 2014). Finally, we include FD-SVRG (Wan et al., 2007), which uses a linear model, to comparatively verify the accuracy of FDSKL. The algorithms for comparison are listed in FIG. 7A, Table 1.

Implementation Details: Our experiments were performed on a 24-core two-socket Intel Xeon CPU E5-2650 v4 machine with 256 GB RAM. We implemented our FDSKL in python, where the parallel computation was handled via MPI4py (Dalcin et al., 2011). The code of LIBSVM is provided by Chang and Lin (2011). We used the implementation provided by Dai et al. (2014) for DSG. We modified the implementation of DSG such that it uses constant learning rate. Our experiments use the following binary classification datasets as described below.

Datasets: FIG. 7B, Table 2 shows benchmark datasets used in the experiments. The eight real-world binary classification datasets shown in Table 2 are obtained from LIBSVM website. We split the dataset 4:1 for training and testing, respectively. Note that in the experiments of the epsilon, real-sim and w8a datasets, PP-SVMV always runs out of memory, which means this method only works when the number of instance is below around 45,000 when using the computation resources specified above.

Results and Discussions: The results are shown in FIGS. 8A-8H, FIGS. 9A-9D and FIGS. 10A-10D. We provide the test errors vs. training time plot on four state-of-the-art kernel methods in FIGS. 8A-8H for the datasets gisette, phishing, a9a, ijcnn1, cod-rna, w8a, real-sim, and epsilon, respectively. It is evident that our algorithm always achieves fastest convergence rate compared to other state-of-art kernel methods. In FIGS. 10A-10D, we demonstrate the training time vs. different training sizes of FDSKL and PP-SVMV for datasets phishing, a9a, cod-ma, and w8a, respectively. Again, the absent results in FIGS. 10B, 10C and 10D for PP-SVMV is because of out of memory. It is obvious that our method has much better scalability than PP-SMV. The reason for this edge of scalability is comprehensive, mostly because FDSKL have adopted the random feature approach, which is efficient and easily parallelizable. Besides, we could also demonstrate that the communication structure used in PP-SVMV is not optimal, which means more time spent in sending and receiving the partitioned kernel matrix.

As mentioned in previous section, FDSKL used a tree structured communication scheme to distribute and aggregate computation. To verify such a systematic design, we also compare the efficiency of three commonly used communication structures: cycle-based, tree-based and star-based. The goal of the comparison task is to compute the kernel matrix (linear kernel) of the training set of four datasets. Specifically, each node maintains a feature subset of the training set, and is asked to compute the kernel matrix using the feature subset only. The computed local kernel matrices on each node are then summed by using one of the three communication structures. Our experiment compares the efficiency (elapsed communication time) of obtaining the final kernel matrix, and the results are given in FIGS. 9A-9D on the datasets gisette, phishing, a9a, and ijcnn1, respectively. From FIGS. 9A-9D, we could make a statement that with the increase of nodes, our communication structure (tree-based) have the lowest communication cost. This explains the poor efficiency of PP-SVMV, which used a cycle-based communication structure, as given in FIGS. 10A-10D.

Figure 11:
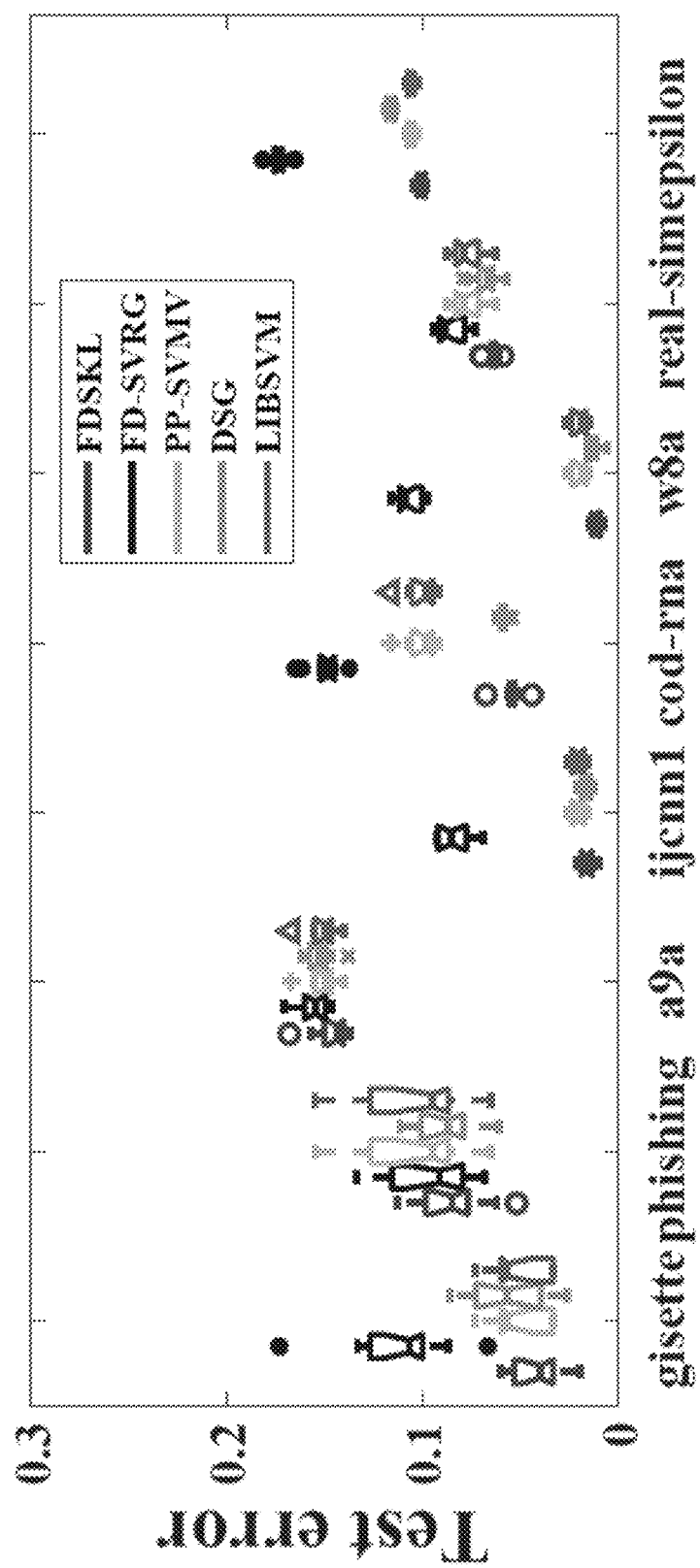
FIG. 11 schematically depicts boxplot of test errors of three kernel methods, linear method (FD-SVRG), and FDSKL according to certain embodiments of the present disclosure.

FIG. 11 is a boxplot test errors of three state-of-the-art kernel methods, linear method (FD-SVRG) and our FDSKL. All results are averaged over 10 different train test split trials. According to the results, our FDSKL always has the lowest test error and variance. And the linear method normally has worse results than other kernel methods.

Conclusion: Privacy-preservation federated learning for vertically partitioned data is urgent currently in machine learning. In certain embodiments and examples of the disclosure, we propose a federated doubly stochastic kernel learning (i.e., FDSKL) algorithm for vertically partitioned data, which breaks the limitation of implicitly linear separability used in the existing privacy-preservation federated learning algorithms. We proved that FDSKL has a sublinear convergence rate, and can guarantee data security under the semi-honest assumption. To the best of our knowledge, FDSKL is the first efficient and scalable privacy-preservation federated kernel method. Extensive experimental results show that FDSKL is more efficient than the existing state-of-the-art kernel methods for high dimensional data while retaining the similar generalization performance.

Certain embodiments of the present disclosure, among other things, have the following beneficial advantages: (1) The FDSKL algorithm can train the vertically partitioned data efficiently, scalably and safely by kernel methods. (2) FDSKL is a distributed doubly stochastic gradient algorithm with constant learning rate which is much faster than the existing doubly stochastic gradient algorithms all of which are built on the diminishing learning rate, and also much faster than existing method of privacy-preserving federated kernel learning algorithm. (3) A tree structured communication scheme is used to distribute and aggregate computation which is much more efficient than the star-structured communication and ring-structured communication, which makes the FDSKL much efficient than existing federated learning algorithms. (4) Existing federated learning algorithms for vertically partitioned data use the encryption technology to keep the algorithm safety which is time consuming. However, the method of the present disclosure uses random perturbations to keep the algorithm safety which is cheaper than the encryption technology and make the FDSKL more efficient than the existing federated learning algorithms. (5) Most of existing federated learning algorithms on vertically partitioned data are limited to linear separable model. The FDSKL of the present disclosure is the first efficient and scalable federated learning algorithm on vertically partitioned data breaking the limitation of implicitly linear separability.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

LISTING OF REFERENCES

Incorporated Herein by Reference in Their Entirety

1. Nadeem Badshah, Facebook to contact 87 million users affected by data breach, The Guardian, Apr. 8, 2018.
2. Chih-Chung Chang and Chih-Jen Lin, LIBSVM: A library for support vector machines, ACM Transactions on Intelligent Systems and Technology, 2011, 2:1-27.
3. Kewei Cheng, Tao Fan, et al., Secureboost: A lossless federated learning framework, 2019, arXiv: 1901.08755.

4. Bo Dai, Bo Xie, et al., Scalable kernel methods via doubly stochastic gradients, Advances in Neural Information Processing Systems, 2014, 3041-3049.
5. Lisandro D. Dalcin, Rodrigo R. Paz, et al., Parallel distributed computing using python, Advances in Water Resources, 2011, 34(9):1124-1139.
6. Wenliang Du and Mikhail J. Atallah, Privacy-preserving cooperative statistical analysis, Proceedings of the 17th Annual Computer Security Applications Conference, 2001, 102-110.
7. Adria Gascon, Phillipp Schoppmann, et al., Secure linear regression on vertically partitioned datasets, IACR Cryptology ePrint Archive, 2016, 892.
8. Adria Gascon, Phillipp Schoppmann, et al., Privacy-preserving distributed linear regression on high-dimensional data, Proceedings on Privacy Enhancing Technologies, 2017, (4):345-364.
9. Stephen Hardy, Wilko Henecka, et al., Private federated learning on vertically partitioned data via entity resolution and additively homomorphic encryption, 2017, arXiv preprint arXiv:1711.10677.
10. Alan F. Karr, Xiaodong Lin, et al., Privacy-preserving analysis of vertically partitioned data using secure matrix products, Journal of Official Statistics, 2009, 25(1):125-138.
11. Richard Nock, Stephen Hardy, et al., Entity resolution and federated learning get a federated resolution, 2018, arXiv preprint arXiv:1803.04035.
12. Ali Rahimi and Benjamin Recht, Random features for largescale kernel machines, Advances in Neural Information Processing Systems 20, 2007, 1177-1184.
13. Ali Rahimi and Benjamin Recht, Weighted sums of random kitchen sinks: replacing minimization with randomization in learning, Advances in Neural Information Processing Systems, 2008, 1313-1320.
14. Ashish P. Sanil, Alan F. Karr, et al., Privacy preserving regression modelling via distributed computation, Proceedings of the Tenth ACM SIGKDD International Conference on Knowledge Discovery and Data Mining, 2004, 677-682.
15. Skillicorn, D. B., and Mcconnell, S. M. 2008. Distributed prediction from vertically partitioned data, Journal of Parallel & Distributed Computing, 2007, 68(1):16-36.
16. Jaideep Vaidya and Chris Clifton, Privacy preserving association rule mining in vertically partitioned data, Proceedings of the Eighth ACM SIGKDD International Conference on Knowledge Discovery and Data Mining, 2002, 639-644.
17. Li Wan, Wee Keong Ng, Shuoguo Han, and Vincent C.S. Lee, Privacy preservation for gradient descent methods, Proceedings of the 13th ACM SIGKDD International Conference on Knowledge Discovery and Data Mining, 2007, 775-783.
18. Bo Xie, Yingyu Liang, and Le Song, Scale up nonlinear component analysis with doubly stochastic gradients, Advances in Neural Information Processing Systems, 2015, 2341-2349.
19. Jiyan Yang, Vikas Sindhwani, et al., Random laplace feature maps for semigroup kernels on histograms, Proceedings of the IEEE Conference on Computer Vision and Pattern Recognition, 2014, 971-978.
20. Hwanjo Yu, Jaideep Vaidya, and Xiaoqian Jiang, Privacy-preserving SVM classification on vertically partitioned data, Pacific-Asia Conference on Knowledge Discovery and Data Mining, 2006, 647-656.
21. Gong-Duo Zhang, Shen-Yi Zhao, Hao Gao, and Wu-Jun Li, Feature-distributed SVRG for high-dimensional linear classification, 2018, arXiv:1802.03604.
22. Haizhang Zhang, Yuesheng Xu, and Jun Zhang, Reproducing kernel banach spaces for machine learning, Journal of Machine Learning Research, 2009, 10:2741-2775.
23. Walter Rudin, Fourier analysis on groups, Interscience Publishers, division of John Wiley and Sons New York & London, 1962, 12.
24. Alain Berlinet and Christine Thomas-Agnan, Reproducing kernel Hilbert spaces in probability and statistics, 2011, Springer Science & Business Media.

What is claimed is:

1. A system for prediction using a machine learning model, comprising:
an active computing device and at least one passive computing device in communication with the active computing device, wherein each of the active and passive computing devices comprises local data, the active computing device comprises a processor and a storage device storing computer executable code, and the computer executable code, when executed at the processor, is configured to:
obtain parameters of the machine learning model;
retrieve an instance from the local data of the active computing device;
sample a random direction of the instance;
compute a dot product of the random direction and the instance, and calculate a random feature based on the dot product;
compute a predicted value of the instance in the active computing device, instruct the at least one passive computing device to compute a predicted value of the instance in the at least one passive computing device, and summarize the predicted values from the active and the at least one passive computing devices to obtain a final predicted value of the instance, wherein the predicted value of the instance in the at least one passive computing device is obtained based on the local data of the at least one passive computing device;
determine a model coefficient using the random feature and a difference between the final predicted value of the instance and a target value of the instance;
update the machine learning model using the model coefficient; and
predict a value for a new instance using the machine learning model.

2. The system of claim 1, wherein the parameters of the machine learning model comprises a constant learning rate.

3. The system of claim 1, wherein the instance is characterized by an index, the computer executable code is configured to provide the index to the at least one passive client computer, and each of the active and the at least one passive client computers is configured to sample the random direction based on the index.

4. The system of claim 3, wherein the random direction is sampled from a Gaussian distribution.

5. The system of claim 1, wherein the random feature is calculated using equation $\phi_{w_i}(x_i)=\sqrt{2}\cos(w_i^T x_i + b)$, $x_i$ represents a part of the instance, the instance is indexed by i, $w_i$ is a random direction corresponding to the index, $w_i^T$ is a transpose operation of $w_i$, $\phi_{w_i}(x_i)$ is a random feature of the instance $x_i$, $w_i^T x_i$ is the dot product, and b is a random value.

6. The system of claim 5, wherein $w_i^T x_i + b$ is calculated by $\Sigma_{\hat{i}=1}^{q}((w_i)_{\mathcal{G}_{\hat{i}}}^T(x_i)_{\mathcal{G}_{\hat{i}}} + b^{\hat{i}}) - \Sigma_{\hat{i} \neq 1}^{q} b^{\hat{i}}$, q is a number of the active and the at least one passive computing devices, $\hat{i}$ is $\hat{i}$-th of q computing devices, $(w_i)_{\hat{g}_l}$ is a random direction corresponding to the index i in the $\hat{l}$-th computing device, $(w_i)_{\hat{g}_l}^T$ is a transpose operation of $(w_i)_{\hat{g}_l}$, $(x_i)_{\hat{g}_l}$ is an instance in the $\hat{l}$-th computing device, $(w_i)_{\hat{g}_l}^T(x_i)_{\hat{g}_l}$ is the dot product of the random direction and the instance in the $\hat{l}$-th computing device, $b^{\hat{l}}$ is a random number generated in the $\hat{l}$-th computing device, and l' is the active computing device.

7. The system of claim 1, wherein predicted value of the instance in the active computing device is calculated using a number of iterations, and the predicted value is updated in the iterations using the equation $f'(x)=f'(x)+\alpha_i\phi_{w_i}(x)$, x is the instance, $f'(x)$ is the predicted value of the instance, $\alpha_i$ is model coefficient of the instance, and $\phi_{w_i}(x)$ is the random feature.

8. The system of claim 7, wherein the iterations equals to or is greater than 2.

9. The system of claim 1, wherein the computer executable code is configured to update the machine learning model by replacing each of the previous model coefficients using the equation of $\alpha_j=(1-\gamma\lambda)\alpha_j$, wherein $\alpha_j$ is any one of the previous model coefficients which is indexed by j, $\gamma$ is a learning rate of the machine learning model, and $\lambda$ is a regularization parameter of the machine learning model.

10. The system of claim 1, wherein communication between the active and the at least one passive computing devices is performed using a tree structure via a coordinator computing device that is in communication with the active and the at least one passive computing devices.

11. A method for prediction using a machine learning model, comprising:
obtaining, by an active computing device, parameters of the machine learning model;
retrieving, by the active computing device, an instance from the local data of the active computing device;
sampling, by the active computing device, a random direction of the instance;
computing, by the active computing device, a dot product of the random direction and the instance, and calculating a random feature based on the dot product;
computing, by the active computing device, a predicted value of the instance, instructing at least one passive computing device to compute a predicted value of the instance therein, and summarizing the predicted values from the active and the at least one passive computing devices to obtain a final predicted value of the instance, wherein the predicted value of the instance in the at least one passive computing device is obtained based on the local data of the at least one passive computing device;
determining, by the active computing device, a model coefficient using the random feature and a difference between the final predicted value of the instance and a target value of the instance;
updating, by the active computing device, the machine learning model using the model coefficient; and
predicting, by the active computing device, a value for a new instance using the machine learning model.

12. The method of claim 11, wherein the parameters of the machine learning model comprises a constant learning rate.

13. The method of claim 11, wherein the instance is characterized by an index, the computer executable code is configured to provide the index to the at least one passive client computer, and each of the active and the at least one passive client computers is configured to sample the random direction based on the index.

14. The method of claim 13, wherein the random direction is sampled from a Gaussian distribution.

15. The method of claim 11, wherein the random feature is calculated using equation $\phi_{w_i}(x_i)=\sqrt{2}\cos(w_i^T x_i+b)$, $x_i$ represents a part of the instance, the instance is indexed by i, $w_i$ is a random direction corresponding to the index, $w_i^T$ is a transpose operation of $w_i$, $\phi_{w_i}(x_i)$ is a random feature of the instance $x_i$, $w_i^T x_i$ is the dot product, and b is a random value.

16. The method of claim 11, wherein $w_i^T x_i+b$ is calculated by $\Sigma_{\hat{l}=1}^q ((w_i)_{\hat{g}_l}^T (x_i)_{\hat{g}_l} + b^{\hat{l}}) - \Sigma_{\hat{l}\neq l'}^q b^{\hat{l}}$, q is a number of the active and the at least one passive computing devices, $\hat{l}$ is $\hat{l}$-th of q computing devices, $(w_i)_{\hat{g}_l}$ is a random direction corresponding to the index i in the $\hat{l}$-th computing device, $(w_i)_{\hat{g}_l}^T$ is a transpose operation of $(w_i)_{\hat{g}_l}$, $(x_i)_{\hat{g}_l}$ is an instance in the $\hat{l}$-th computing device, $(w_i)_{\hat{g}_l}^T(x_i)_{\hat{g}_l}$ is the dot product of random direction and the instance in the $\hat{l}$-th computing device, $b^{\hat{l}}$ is a random number generated in the $\hat{l}$-th computing device, and l' is the active computing device.

17. The method of claim 11, wherein predicted value of the instance in the active computing device is calculated using a number of iterations, and the predicted value is updated in the iterations using the equation $f'(x)=f'(x)+\alpha_i\phi_{w_i}(x)$, x is the instance, $f'(x)$ is the predicted value of the instance, $\alpha_i$ is model coefficient of the instance, and $\phi_{w_i}(x)$ is the random feature.

18. The method of claim 11, wherein the computer executable code is configured to update the machine learning model by replacing each of the previous model coefficients using the equation of $\alpha_j=(1-\gamma\lambda)\alpha_j$, wherein $\alpha_j$ is any one of the previous model coefficients which is indexed by j, $\gamma$ is a learning rate of the machine learning model, and $\lambda$ is a regularization parameter of the machine learning model.

19. The method of claim 11, wherein communication between the active and the at least one passive computing devices is performed using a tree structure via a coordinator computing device that is in communication with the active and the at least one passive computing devices.

20. A non-transitory computer readable medium storing computer executable code, wherein the computer executable code, when executed at a processor of an active computing device, is configured to:
obtain parameters of a machine learning model;
retrieve an instance from the local data of the active computing device;
sample a random direction of the instance;
compute a dot product of the random direction and the instance, and calculate a random feature based on the dot product;
compute a predicted value of the instance in the active computing device, instruct at least one passive computing device to compute a predicted value of the instance therein, and summarize the predicted values from the active and the at least one passive computing devices to obtain a final predicted value of the instance, wherein the predicted value of the instance in the at least one passive computing device is obtained based on the local data of the at least one passive computing device;
determine a model coefficient using the random feature and a difference between the final predicted value of the instance and a target value of the instance;
update the machine learning model using the model coefficient; and
predict a value for a new instance using the machine learning model.

* * * * *